US012765194B2

(12) United States Patent
Choi et al.

(10) Patent No.: US 12,765,194 B2
(45) Date of Patent: Oct. 13, 2026

(54) DISPLAY DEVICE

(71) Applicant: SAMSUNG DISPLAY CO., LTD., Yongin-si (KR)

(72) Inventors: Min Oh Choi, Yongin-si (KR); Gun Hee Kim, Yongin-si (KR); Sun Ho Kim, Yongin-si (KR); Kwang Soo Bae, Gyeonggi-do (KR); Dae Young Lee, Yongin-si (KR); Sung Chan Jo, Yongin-si (KR); Chung Sock Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 683 days.

(21) Appl. No.: 18/157,971

(22) Filed: Jan. 23, 2023

(65) Prior Publication Data

US 2023/0329050 A1 Oct. 12, 2023

(30) Foreign Application Priority Data

Apr. 7, 2022 (KR) ........................ 10-2022-0043385

(51) Int. Cl.
*H10K 59/121* (2023.01)
*H10K 39/34* (2023.01)
*H10K 59/131* (2023.01)

(52) U.S. Cl.
CPC ........... *H10K 59/131* (2023.02); *H10K 39/34* (2023.02); *H10K 59/121* (2023.02)

(58) Field of Classification Search
CPC ..... H10K 59/131; H10K 59/121; H10K 39/34
USPC .................................................. 313/498–512
See application file for complete search history.

(56) References Cited

U.S. PATENT DOCUMENTS

| | | | |
|---|---|---|---|
| 9,316,856 | B2 | 4/2016 | Park et al. |
| 9,356,076 | B2 | 5/2016 | Wang et al. |
| 10,838,556 | B2 | 11/2020 | Yeke Yazdandoost et al. |
| 10,978,523 | B2 | 4/2021 | Park et al. |
| 11,450,264 | B2 | 9/2022 | Hong et al. |
| 11,600,096 | B2 | 3/2023 | Lee et al. |
| 11,716,892 | B2 | 8/2023 | Park et al. |
| 11,790,687 | B2 | 10/2023 | Han et al. |
| 11,823,616 | B2 | 11/2023 | Hong et al. |

(Continued)

FOREIGN PATENT DOCUMENTS

| | | | |
|---|---|---|---|
| KR | 10-2013-0005621 | A | 1/2013 |
| KR | 10-2015-0142816 | A | 12/2015 |

(Continued)

OTHER PUBLICATIONS

Notice of Allowance dated Aug. 21, 2026 in corresponding Korean Patent Application Serial No. 10-2022-0043385, in Korean, 3 pages.

*Primary Examiner* — Christopher M Raabe
(74) *Attorney, Agent, or Firm* — F. CHAU & ASSOCIATES, LLC

(57) ABSTRACT

A display device includes a substrate that includes a display area and a subsidiary area adjacent to the display area; a first pixel driving unit disposed in the display area; a light-emitting element disposed in the display area and connected to the first pixel driving unit; a plurality of sensor driving units disposed in the subsidiary area; and a plurality of photoelectric conversion elements disposed in the subsidiary area and connected to the plurality of sensor driving units, respectively.

20 Claims, 26 Drawing Sheets

(56) References Cited

U.S. PATENT DOCUMENTS

| | | | | |
|---|---|---|---|---|
| 11,899,862 | B2 | 2/2024 | Bok et al. | |
| 12,067,803 | B2 | 8/2024 | Lee et al. | |
| 2012/0249454 | A1* | 10/2012 | Teraguchi | H10K 59/40 345/173 |
| 2020/0111851 | A1* | 4/2020 | Park | G06F 3/0412 |
| 2021/0056899 | A1* | 2/2021 | Bae | G09G 3/3233 |
| 2021/0175381 | A1* | 6/2021 | Li | H10K 59/121 |
| 2022/0028934 | A1* | 1/2022 | Kim | H10K 59/352 |
| 2022/0173169 | A1* | 6/2022 | Cai | H04N 23/45 |
| 2022/0190038 | A1* | 6/2022 | Tada | H10F 39/12 |
| 2022/0215804 | A1* | 7/2022 | Lee | H10K 59/352 |
| 2022/0285460 | A1* | 9/2022 | Kim | G06F 3/0421 |
| 2023/0195253 | A1* | 6/2023 | Park | H10K 59/00 345/174 |
| 2024/0138219 | A1* | 4/2024 | Jun | H10K 59/80516 |
| 2024/0184390 | A1 | 6/2024 | Bok et al. | |

FOREIGN PATENT DOCUMENTS

| | | | |
|---|---|---|---|
| KR | 10-2020-0040196 | A | 4/2020 |
| KR | 10-2020-0115832 | A | 10/2020 |
| KR | 10-2021-0082316 | A | 7/2021 |
| KR | 10-2021-0095255 | | 8/2021 |
| KR | 10-2022-0009562 | A | 1/2022 |

* cited by examiner

PX: PDU1, LE

PX: PDU2, SLE
PS: SDU, PD

DISPLAY DEVICE

CROSS REFERENCE TO RELATED APPLICATION

This application claims priority under 35 U.S.C. 119 from Korean Patent Application No. 10-2022-0043385, filed on Apr. 7, 2022 in the Korean Intellectual Property Office, the contents of which are herein incorporated by reference in their entirety.

TECHNICAL FIELD

Embodiments of the present disclosure are directed to a display device.

DISCUSSION OF THE RELATED ART

Display devices are used in a variety of electronic devices, such as smart phones, tablet PCs, laptop computers, monitors and televisions. Recently, as the mobile communications technology evolves, portable electronic devices, such as smartphones, tablet PCs and laptop computers, are becoming more widely used. As privacy information is stored in portable electronic devices, fingerprint authentication has been used to verify a user's fingerprint, which is biometric information, to protect such privacy information.

For example, a display device can authenticate a user's fingerprint by optical, ultrasonic, or capacitive sensing means, etc. An optical sensing means authenticates a user's fingerprint by sensing light reflected from the user's fingerprint. A display device includes a display panel that includes pixels that display images and photo sensors that sense light to optically authenticate a user's fingerprint.

A display device can include a variety of optical devices, such as an image sensor that captures an image on a front side of the display device, a proximity sensor that detects whether a user is located close to the front side, and an illuminance sensor that senses the illuminance on the front side of the display device.

SUMMARY

Embodiments of the present disclosure provide a display device that prevents a decrease in resolution of a display panel that includes pixels and photo sensors and reduces a dead space to enlarge a display area or a light sensing area.

According to an embodiment of the present disclosure, there is provided a display device that includes a substrate that includes a display area and a subsidiary area adjacent to the display area; a first pixel driving unit disposed in the display area; a light-emitting element disposed in the display area and connected to the first pixel driving unit; a plurality of sensor driving units disposed in the subsidiary area; and a plurality of photoelectric conversion elements disposed in the subsidiary area and connected to the plurality of sensor driving units, respectively.

One sensor driving unit of the plurality of sensor driving units and one photoelectric conversion element of the plurality of photoelectric conversion elements may be spaced apart from each other when viewed from top.

The subsidiary area may comprise a first subsidiary area and a second subsidiary area.

The first subsidiary area is disposed between the display area and the second subsidiary area. The plurality of sensor driving units may be disposed in the first subsidiary area, and one photoelectric conversion element of the plurality of photoelectric conversion elements may be disposed in the second subsidiary area.

The display device may further include connection lines that connect the plurality of sensor driving units with the plurality of photoelectric conversion elements, respectively. The connection lines may be disposed across the first subsidiary area and the second subsidiary area.

The display device may further include a plurality of second pixel driving units disposed in the subsidiary area, and a plurality of subsidiary light-emitting elements connected to one of the plurality of second pixel driving units.

The subsidiary light-emitting elements may be adjacent to each other in one direction and are connected through a pixel electrode.

Each of the plurality of subsidiary light-emitting elements may emit a same light.

A first subsidiary light-emitting element of the plurality of subsidiary light-emitting elements may overlap one of the second pixel driving units in a thickness direction of the substrate, and a second subsidiary light-emitting element of the plurality of subsidiary light-emitting elements may not overlap the second pixel driving units in the thickness direction of the substrate.

The sensor driving units may be connected to the plurality of photoelectric conversion elements.

The plurality of subsidiary light-emitting elements and the plurality of photoelectric conversion elements may be alternately arranged along one direction.

The plurality of second pixel driving units and the plurality of sensor driving units may be alternately arranged along one direction.

The display device may further include a pixel unit formed by the plurality of subsidiary light-emitting elements. An area of each of the plurality of photoelectric conversion elements may correspond to an area of the pixel unit.

An area of each of the plurality of sensor driving units may be greater than an area of the first pixel driving unit.

A first photoelectric conversion element of the plurality of photoelectric conversion elements that is disposed in the first subsidiary area may be connected to one of the plurality of sensor driving units, and may overlap another of the plurality of sensor driving units in a thickness direction of the substrate.

According to another embodiment of the present disclosure, there is provided a display device that includes a substrate that includes a display area and a subsidiary area adjacent to the display area; a scan driver disposed in the subsidiary area and that applies a scan signal; a plurality of sensor driving units disposed in the subsidiary area; and a plurality of photoelectric conversion elements disposed in the subsidiary area and connected to the plurality of sensor driving units, respectively. One photoelectric conversion element of the plurality of photoelectric conversion elements overlaps the scan driver in a thickness direction of the substrate.

One photoelectric conversion element of the plurality of photoelectric conversion elements does not overlap with the plurality of sensor driving units in the thickness direction of the substrate.

None of the plurality of sensor driving units overlap the scan driver in the thickness direction of the substrate.

The subsidiary area may include a first subsidiary area and a second subsidiary area. The first subsidiary area is disposed between the display area and the second subsidiary area. The plurality of sensor driving units may be disposed in the first subsidiary area, and the scan driver may be disposed in the second subsidiary area.

The display device may further include a second pixel driving unit disposed in the first subsidiary area, and a plurality of subsidiary light-emitting elements connected to the second pixel driving unit.

The second pixel driving unit may be closer to the display area than is the sensor driving unit.

The display device may further include a first pixel driving unit disposed in the display area and a light-emitting element connected to the first pixel driving unit.

According to exemplary embodiments of the present disclosure, a decrease in resolution of a display panel can be prevented by reducing a dead space by way of disposing photo sensors in a subsidiary area adjacent to a display area.

DETAILED DESCRIPTION

Embodiments of the disclosure will now be described more fully hereinafter with reference to the accompanying drawings, in which embodiments of the invention are shown. The invention may, however, be embodied in different forms and should not be construed as limited to the embodiments set forth herein. The same reference numbers may indicate the same components throughout the specification.

It will also be understood that when a layer is referred to as being "on" another layer or substrate, it can be directly on the other layer or substrate, or intervening layers may also be present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Hereinafter, exemplary embodiments of the present disclosure will be described in detail with reference to the accompanying drawings.

Figure 1:
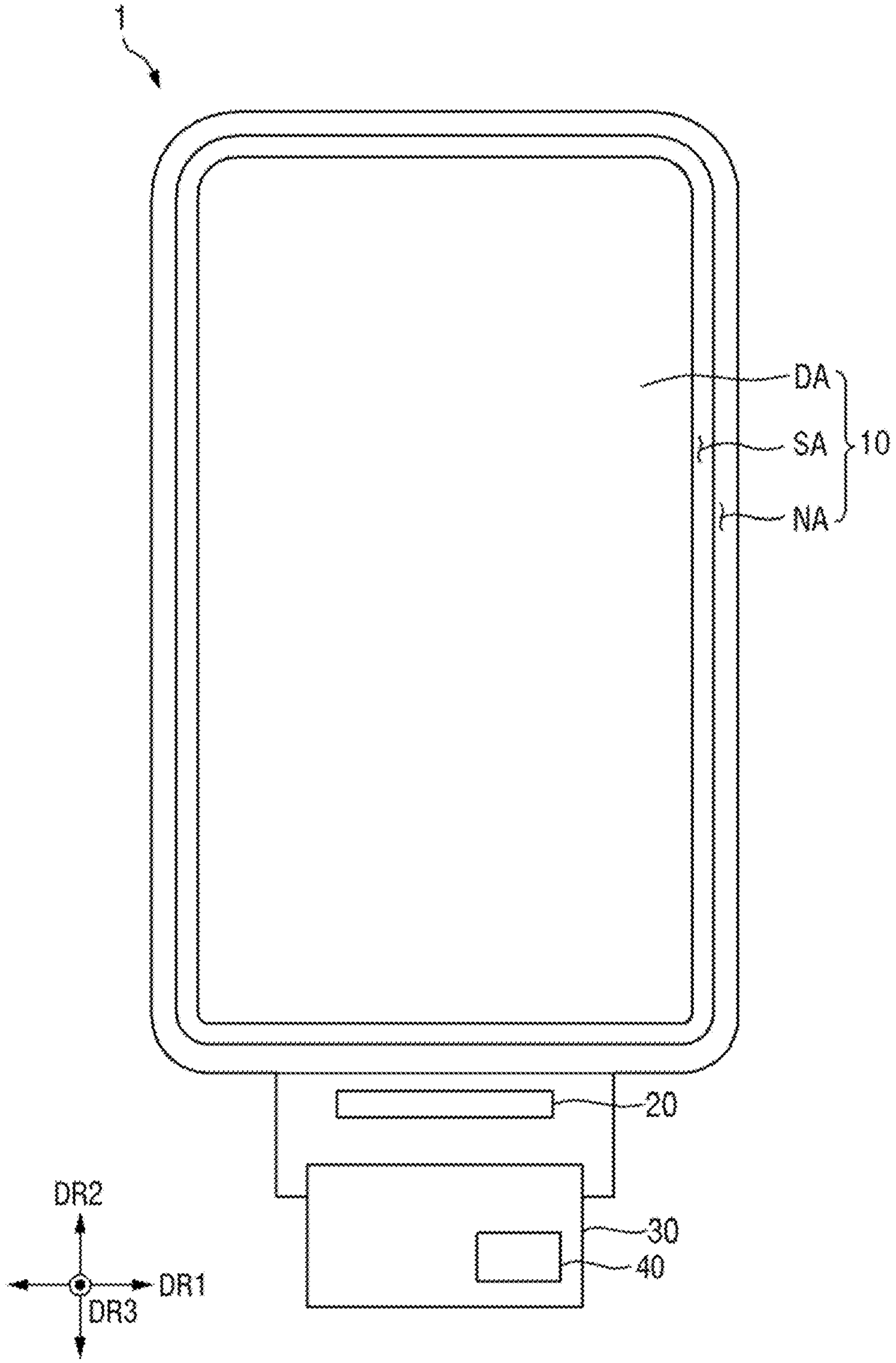
FIG. 1 is a plan view of a display device according to an exemplary embodiment of the present disclosure.

FIG. 1 is a plan view of a display device according to an exemplary embodiment of the present disclosure.

In FIG. 1, a first direction DR1, a second direction DR2 and a third direction DR3 are indicated. The first direction DR1 refers to a direction parallel to a side of the display device 1, for example, the horizontal or longer side direction of the display device 1 when viewed from the top. The second direction DR2 refers to a direction parallel to another side of the display device 1 that meets the side of the display device 1, for example, the vertical or shorter side direction of the display device 1 when viewed from the top. In the following description, one side in the first direction DR1 indicates the right side when viewed from the top, the opposite side in the first direction DR1 indicates the left side when viewed from the top, one side in the second direction DR2 indicates the upper side when viewed from the top, and the opposite side in the second direction DR2 indicates the lower side when viewed from the top, for convenience of illustration. The third direction DR3 refers to the thickness direction of the display device 1, and is normal to a plane defined by the first direction DR1 and the second direction DR2. It should be understood that the directions referred to in the exemplary embodiments are relative directions, and the exemplary embodiments are not limited to the directions mentioned.

As used herein, the terms “top,” “upper surface” and “upper side” in the third direction DR3 refer to the display side of a display panel 10, whereas the terms “bottom,” “lower surface” and “rear side” refer to the opposite side of the display panel 10, unless stated otherwise.

Referring to FIG. 1, in an embodiment, the display device 1 includes a variety of electronic devices that provide a display screen. Examples of the display device 1 include, but are not limited to, a mobile phone, a smart phone, a tablet PC, a mobile communications terminal, an electronic organizer, an e-book, a personal digital assistant (PDA), a portable multimedia player (PMP), a navigation device, an ultra mobile PC (UMPC), a television set, a game machine, a wristwatch-type electronic device, a head-mounted display, a personal computer monitor, a laptop computer, a vehicle instrument cluster, a digital camera, a camcorder, an outdoor billboard, an electronic billboard, various medical apparatuses, various inspection devices, various home appliances that include a display area such as a refrigerator and a laundry machine, Internet of things (IoT) devices, etc. Examples of the display device 1 to be described below include, but are not limited to, a smartphone, a tablet PC, a laptop computer, etc.

The display device 1 includes a display panel 10, a display driver circuit 20, a circuit board 30 and a read-out circuit 40.

The display panel 10 includes a display area DA, a subsidiary area SA, and a peripheral area NA. In the display area DA, images can be displayed. The shape of the display area DA may be, but is not limited to, a rectangle. However, embodiments are necessarily limited thereto, and some embodiment, the display area DA can have a variety of other shapes. The display area DA occupies most of the display panel 10. A plurality of light-emitting elements LE (see FIG. 2) that display images are disposed in the display area DA.

The subsidiary area SA is adjacent to the display area DA. The subsidiary area surrounds the display area DA. In an embodiment, the subsidiary area SA is located on two sides of the display area DA.

The subsidiary area SA is an auxiliary display area that assists the display area where images are displayed, and is a light-sensing area that responds to light. The light-sensing area is used for fingerprint sensing. A plurality of photoelectric conversion elements PD (see FIG. 2) that respond to light and convert it into an electrical signal are disposed in the light-sensing area.

The peripheral area NA is disposed around the display area DA and the subsidiary area SA. The peripheral area NA is a bezel area or a dead space. The peripheral area NA surrounds all four sides of the display area DA and the subsidiary area SA, but embodiments of the present disclosure are not necessarily limited thereto.

The display driver circuit 20 is disposed in the peripheral area NA. The display driver circuit 20 outputs signals and voltages that drive the plurality of light-emitting elements LE and the plurality of photoelectric conversion elements PD. In an embodiment, the display driver circuit 20 is implemented as an integrated circuit (IC) and is mounted on the display panel 10. Signal lines that transmit signals that drive the display panel 10 between the display driver circuit 20 and the peripheral area NA are further disposed in the display panel 10. In an embodiment, the display driver circuit 20 is mounted on the circuit board 30.

In addition, the read-out circuit 40 is disposed in the peripheral area NA. The read-out circuit 40 is connected to each of the photoelectric conversion elements PD through a signal line, and receives an electric current that flows through each of the photoelectric conversion elements PD to detect a user’s fingerprint input. In an embodiment, the read-out circuit 40 is implemented as an integrated circuit (IC), and is attached to the display panel 10 by one of a chip on film (COF) technique, a chip on glass (COG) technique, or a chip on plastic (COP) technique.

The circuit board 30 is attached to one end of the display panel 10 using an anisotropic conductive film (ACF). Lead lines of the circuit board 30 are electrically connected to a pad area of the display panel 10. The circuit board 30 may be a flexible printed circuit board (FPCB) or a flexible film such as a chip-on-film (COF).

Figure 2:
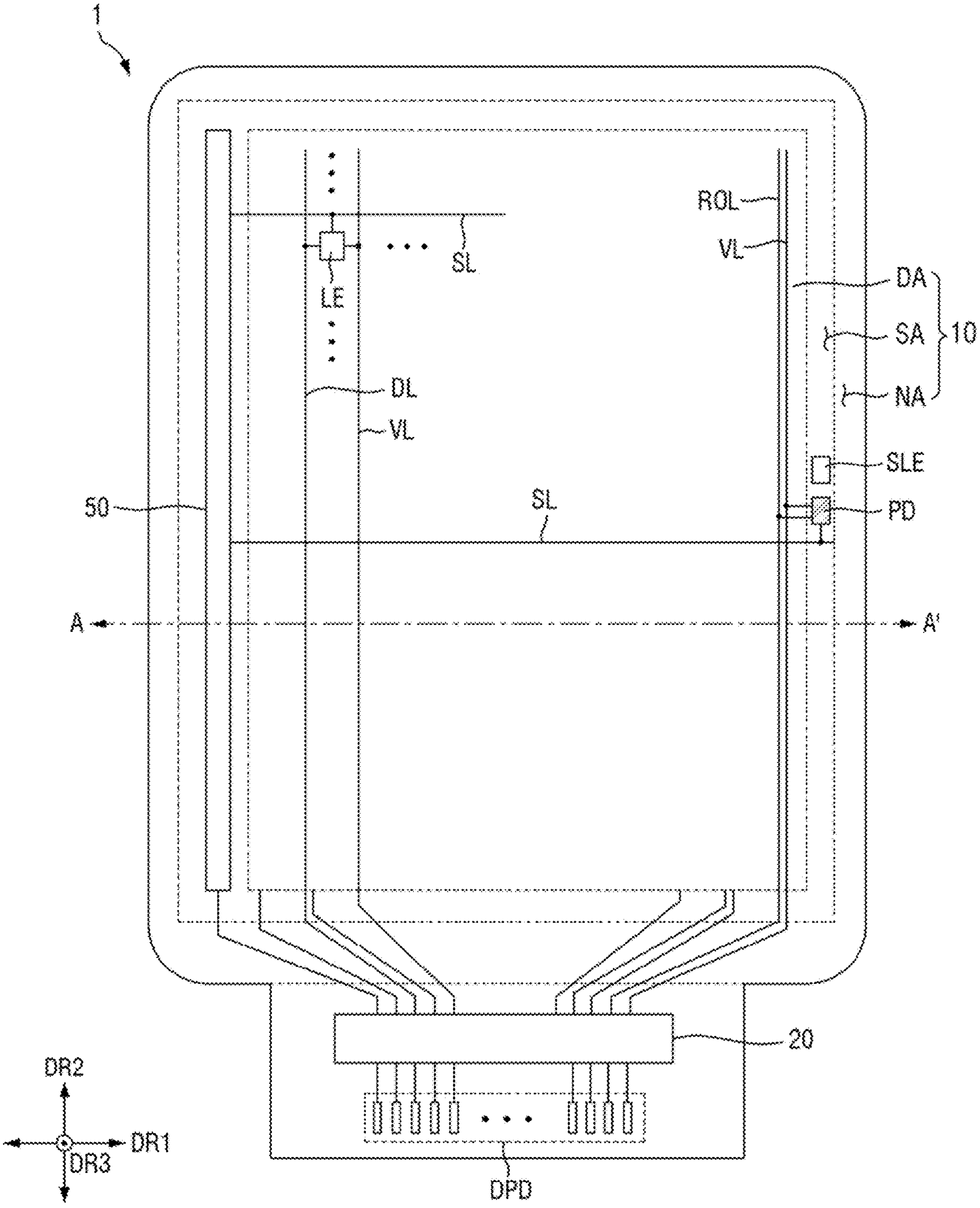
FIG. 2 is a plan view of a display panel according to an exemplary embodiment of the present disclosure.
Figure 3:
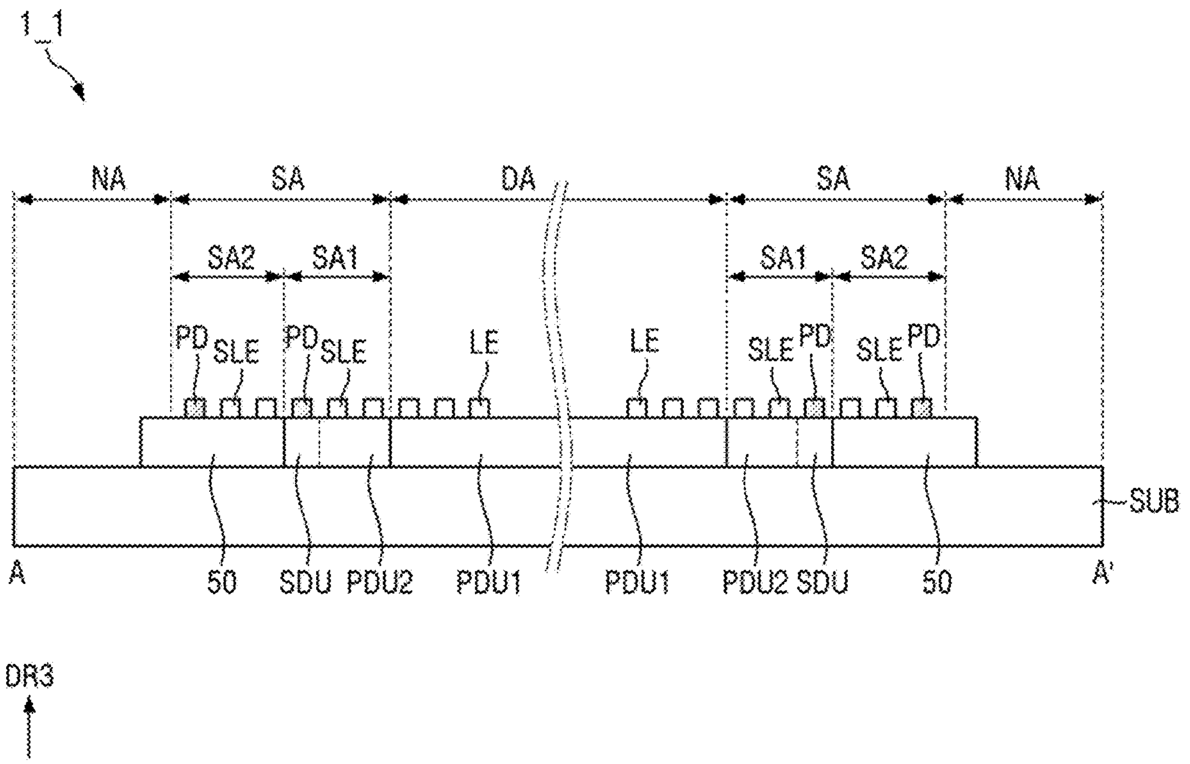
FIG. 3 is a cross-sectional view taken along line A-A' of FIG. 2 according to an exemplary embodiment of the present disclosure.

FIG. 2 is a plan view of a display panel according to an exemplary embodiment of the present disclosure. FIG. 3 is a cross-sectional view taken along line A-A' of FIG. 2 according to an exemplary embodiment of the present disclosure.

Referring to FIGS. 2 and 3, in an embodiment, a plurality of light-emitting elements LE are disposed in the display area DA of the display panel 10. A plurality of subsidiary light-emitting elements SLE are disposed in the subsidiary area SA of the display panel 10.

The plurality of light-emitting elements LE and the plurality of subsidiary light-emitting elements SLE are electrically connected to the plurality of signal lines SL, DL and VL. For example, the light-emitting elements LE are connected to scan lines SL that extend in the first direction DR1, data lines DL that extend in the second direction DR2, and voltage lines VL that extend in the second direction DR2.

Each of the light-emitting elements LE and the subsidiary light-emitting elements SLE is associated with a respective pixel, and display images through light emitted from the light-emitting elements LE and the subsidiary light-emitting elements SLE.

According to this exemplary embodiment, the size of the light-emitting elements LE may be equal to or different from the size of the subsidiary light-emitting elements SLE. The size of the light-emitting elements refers to the area where each of the light-emitting elements emits light. The number of light-emitting elements LE per unit area is less than the number of subsidiary light-emitting elements SLE per unit area. It should be understood, however, that embodiments of the present disclosure are not necessarily limited thereto. The resolution of the display area DA is equal to or different from the resolution of the subsidiary area SA. In embodiments, the arrangement, size and resolution of the light-emitting elements LE and the subsidiary light-emitting elements SLE can be altered in a variety of ways.

A plurality of photoelectric conversion elements PD are disposed in the subsidiary area SA of the display panel 10. The plurality of photoelectric conversion elements PD are electrically connected to the plurality of signal lines SL and a plurality of read-out lines (ROL) that extend in the second direction DR2. For example, the photoelectric conversion elements PD are connected to the scan lines SL that extend in the first direction DR1 and the read-out lines ROL that extend in the second direction DR2.

Each of the photoelectric conversion elements PD works as a photo sensor and senses external light, so that a user's fingerprint can be identified through the photoelectric conversion elements PD.

According to an embodiment, the size of the photoelectric conversion elements PD may be equal to or different from the size of the subsidiary light-emitting elements SLE. The size of the photoelectric conversion elements refers to the area where each of the photoelectric conversion elements receives light. The number of photoelectric conversion elements PD per unit area is less than or equal to the number of subsidiary light-emitting elements SLE or the number of light-emitting elements LE per unit area. In embodiments, the arrangement and size of the photoelectric conversion elements PD and the subsidiary light-emitting elements SLE can be altered in a variety of ways.

The display device 1 includes a plurality of pixel driving units PDU1 and PDU2 disposed on a substrate SUB. The pixel driving units PDU1 and PDU2 include first pixel driving units PDU1 and second pixel driving units PDU2. The first pixel driving units PDU1 are disposed in the display area DA, and the second pixel driving units PDU2 are disposed in the subsidiary area SA. The first pixel driving units PDU1 are connected to the light-emitting elements LE, and the second pixel driving units PDU2 are connected to the subsidiary light-emitting elements SLE. One first pixel driving unit PDU1 is connected to one or more light-emitting elements LE, and one second pixel driving unit PDU2 is connected to one or more subsidiary light-emitting elements SLE. For example, one first pixel driving unit PDU1 is connected to one light-emitting element LE, and one second pixel driving unit PDU2 is connected to two or more subsidiary light-emitting elements SLE.

A plurality of sensor driving units SDU are further disposed on the substrate SUB. The sensor driving units SDU are disposed in the subsidiary area SA. The sensor driving units SDU are connected to the photoelectric conversion elements PD. One sensor driving unit SDU is connected to one or more photoelectric conversion elements PD. In the example shown in FIGS. 11 and 12, one sensor driving unit SDU is connected to two or more photoelectric conversion elements PD, and in the example shown in FIGS. 17 and 21, one sensor driving unit SDU is connected to one photoelectric conversion element PD.

The area of one sensor driving unit SDU differs from the area of one pixel driving unit PDU1 and PDU2. For example, the second pixel driving unit PDU2 and the sensor driving unit SDU have the same length and different widths. For example, the second pixel driving unit PDU2 and the sensor driving unit SDU have the same width and different lengths. For example, the area of the sensor driving unit SDU is greater than the area of the second pixel driving unit PDU2. In an embodiment, the area of the sensor driving unit SDU is four times the area of the second pixel driving unit PDU2. This will be described in more detail with reference to FIGS. 17 and 21.

The display panel 10 includes a scan driver 50 that drives the plurality of light-emitting elements LE, the plurality of subsidiary light-emitting elements SLE, and the plurality of photoelectric conversion elements PD. The scan driver 50 sequentially supplies a plurality of scan signals to the plurality of scan lines SL. The scan driver 50 is integrated onto the substrate SUB and is located on one side of the display area DA. In an embodiment, the scan driver is located on both sides of the substrate. The scan driver 50 is disposed in the subsidiary area SA. However, embodiments are not necessarily limited thereto, and in an embodiment, a part of the scan driver 50 is disposed in the subsidiary area SA, and the other part thereof is disposed in the peripheral area NA. The scan driver 50 includes a plurality of transistors that generate a scan control signal.

The plurality of data lines DL, the plurality of read-out lines ROL and the voltage lines VL are connected to the pad area DPD of the peripheral area NA. The data lines DL supply data voltages from the display driver circuit 20 to the pixel driving units PDU1 and PDU2. The read-out lines ROL deliver a sensing signal generated by a photocurrent of the photoelectric conversion elements PD to the read-out circuit 40 (see FIG. 1). The voltage lines VL supply voltages that drive the light-emitting elements LE, the subsidiary light-emitting elements SLE, and the photoelectric conversion elements PD.

Hereinafter, a layout of the display area DA and the subsidiary area SA will be described in detail with reference to FIG. 3.

In an embodiment, the display area DA, the first pixel driving units PDU1, and the light-emitting elements LE that receive a driving current from the first pixel driving units PDU1 are disposed. In the display area DA, light is emitted by the light-emitting elements LE. The light-emitting elements LE overlap in the third direction DR3 with the first pixel driving units PDU1 that are electrically connected thereto and that provide the driving current. Herein, one first pixel driving unit PDU1 and one light-emitting element LE that receives the driving current therefrom are defined as a first pixel.

In the subsidiary area SA, the subsidiary light-emitting elements SLE that receive a driving current from the second pixel driving units PDU2 are disposed. The subsidiary area SA is where light is emitted by the subsidiary light-emitting elements SLE. The subsidiary light-emitting elements SLE might or might not overlap the second pixel driving units PDU2 that are electrically connected thereto and that provide the driving current.

In addition, the photoelectric conversion elements PD that provide a sensing current to the sensor driving units SDU are disposed in the subsidiary area SA. The subsidiary area SA is a light-sensing area in which the photoelectric conversion elements PD sense external light. The photoelectric conversion elements PD might or might not overlap the sensor driving units SDU that are electrically connected thereto and that receive the sensing signal.

The subsidiary area SA is divided into a first subsidiary area SA1 in which the second pixel driving units PDU2 and the sensor driving units SDU are disposed, and a second subsidiary area SA2 in which the scan driver 50 is disposed. The subsidiary light-emitting elements SLE that receive the driving current from the second pixel driving units PDU2 and the photoelectric conversion elements PD that apply the sensing current to the sensor driving units SDU are disposed in the first subsidiary area SA1 and the second subsidiary area SA2. The subsidiary light-emitting elements SLE disposed in the first subsidiary area SA1 as well as the subsidiary light-emitting elements SLE disposed in the second subsidiary area SA2 receive driving current from the second pixel driving units PDU2 disposed in the first subsidiary area SA1. In addition, the photoelectric conversion elements PD disposed in the first subsidiary area SA1 as well as the photoelectric conversion elements PD disposed in the second subsidiary area SA2 transmit sensing current to the sensor driving units SDU disposed in the first subsidiary area SA1.

For example, some of the second pixel driving units PDU2 transmit a driving current to the subsidiary light-emitting elements SLE in the first subsidiary area SA1, and other second pixel driving units PDU2 transmit a driving current to the subsidiary light-emitting elements SLE in the second subsidiary area SA2. Some of the sensor driving units SDU control the sensing current of the photoelectric conversion elements PD of the first subsidiary area SA1, and other sensor driving units SDU control the sensing current of the photoelectric conversion elements PD of the subsidiary area SA2.

For example, one second pixel driving unit PDU2 and one subsidiary light-emitting element SLE that receives the driving current therefrom are defined as a second pixel. As will be described below, the subsidiary light-emitting elements SLE disposed in the first subsidiary area SA1 are referred to as first subsidiary light-emitting elements, and the subsidiary light-emitting elements SLE disposed in the second subsidiary area SA2 are referred to as second subsidiary light-emitting elements.

For example, one sensor driving unit SDU and one photoelectric conversion element PD are defined as a photo sensor.

In the display device 1 according to an exemplary embodiment, some of the subsidiary light-emitting elements SLE are disposed in the second subsidiary area SA2 that overlaps the scan driver 50, so that an additional display area for displaying images can be obtained. Typically, the subsidiary area in which the scan driver 50 is disposed is a dead space in which no image is displayed. According to an exemplary embodiment, the area in which image is displayed can be widened by reducing the dead space.

In addition, since the photoelectric conversion elements PD are disposed in the first and second subsidiary areas SA1 and SA2, a light-sensing area can be obtained without compromising the display area DA. Since the photoelectric conversion elements PD are not disposed in the display area DA, the number of light-emitting elements LE disposed in the display area DA is not reduced, thereby preventing a decrease in resolution of the display device 1.

However, embodiments of the present disclosure are not necessarily limited thereto. In an embodiment, photoelectric conversion elements PD are disposed in the display area DA. When the photoelectric conversion elements PD and the light-emitting elements LE are disposed in the display area DA, they may have various arrangement relationships. In addition, in an embodiment, the sensor driving units SDU are disposed in the display area DA. For example, the sensor driving units SDU and the first pixel driving units PDU1 have various arrangement relationships. For example, the entire surface of the display area DA overlaps the light sensing area.

Figure 4:
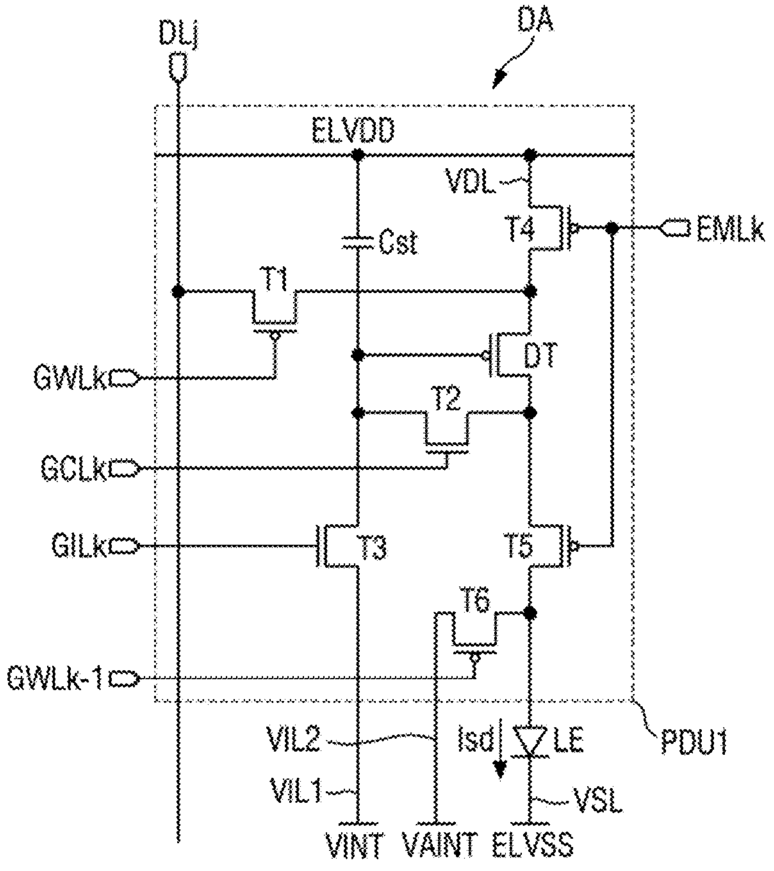
FIG. 4 is a circuit diagram of a pixel in a display area according to an exemplary embodiment of the present disclosure.
Figure 5:
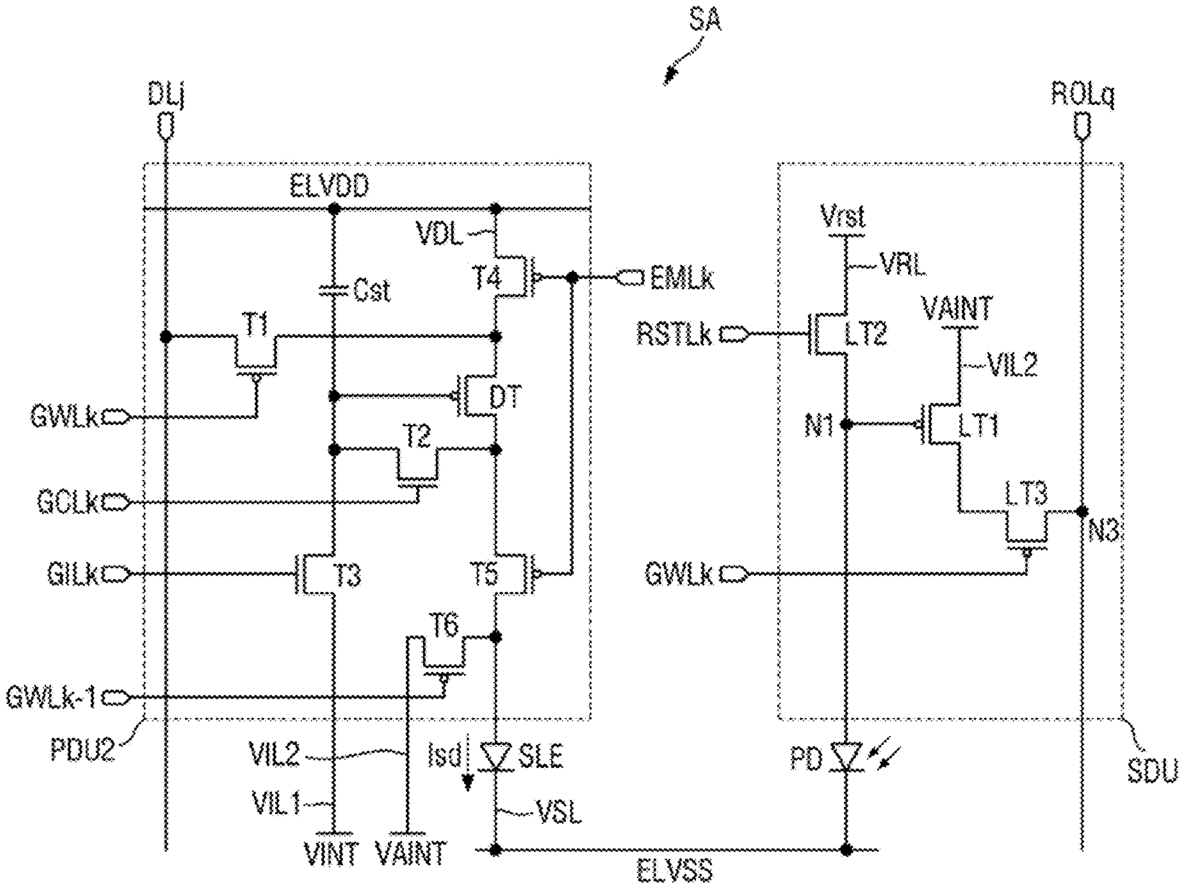
FIG. 5 is a circuit diagram of a pixel and a photo sensor in a subsidiary area according to an exemplary embodiment of the present disclosure.

FIG. 4 is a circuit diagram of a pixel in a display area according to an exemplary embodiment of the present disclosure. FIG. 5 is a circuit diagram of a pixel and a photo sensor in a subsidiary area according to an exemplary embodiment of the present disclosure.

In an embodiment shown in FIG. 4, a pixel PX is disposed in the display area DA and is connected to a kth scan initialization line GILk, a kth scan write line GWLk, a kth scan control line GCLk, a $(k-1)^{th}$ scan write line GWL(k−1) and a $j^{th}$ data line DLj. FIG. 5 is a circuit diagram of a photo sensor PS disposed in the subsidiary area SA and connected to a kth scan write line GWLk, a kth reset control line RSTLk, and a $q^{th}$ read-out line ROLq, together with the circuit diagram of the pixel PX.

First, referring to FIG. 4, in an embodiment, the pixel PX includes a light-emitting element LE, and a first pixel driving unit PDU1 that controls the amount of light emitted from the light-emitting element LE. The first pixel driving unit PDU1 includes a driving transistor DT, a plurality of switch elements, and a first capacitor Cst. The switch elements include first to sixth transistors T1, T2, T3, T4, T5 and T6. The pixel driving unit is connected to a supply voltage line VDL that receives a supply voltage ELVDD, a common voltage line VSL that receives a common voltage ELVSS, a first initialization voltage line VIL1 that receives a first initialization voltage VINT, and a second initialization voltage line VIL2 that receives a second initialization voltage VAINT.

The driving transistor DT includes agate electrode, a first electrode and a second electrode. The drain-source current, hereinafter referred to as a "driving current", of driving transistor DT that flows between the first electrode and the second electrode is controlled by the voltage applied to the gate electrode. The driving current that flows through the channel of the driving transistor DT is proportional to the square of the difference between a voltage between the first electrode and the gate electrode of the driving transistor DT and the threshold voltage, as shown in Equation 1 below:

$$Isd = k' \times (Vsg - Vth)^2 \qquad \text{Equation 1}$$

where Isd denotes the driving current flowing through the channel of the driving transistor DT, k' denotes a proportional coefficient determined by the structure and physical properties of the driving transistor, Vsg denotes a voltage between the first electrode and the gate electrode of the driving transistor, and Vth denotes the threshold voltage of the driving transistor.

The light-emitting element LE emits light as the driving current Isd flows therein. The amount of the light emitted from the light-emitting elements LE increases with the driving current Isd.

In an embodiment, the light-emitting element LE is an organic light-emitting diode that includes an organic emissive layer disposed between an anode electrode and a cathode electrode. Alternatively, in an embodiment, the light-emitting element LE is a quantum-dot light-emitting element that includes a quantum-dot emissive layer disposed between an anode electrode and a cathode electrode. Alternatively, in an embodiment, the light-emitting element LE is an inorganic light-emitting element that includes an inorganic semiconductor disposed between an anode electrode and a cathode electrode. When the light-emitting element LE is an inorganic light-emitting element, it includes a micro light-emitting diode or a nano light-emitting diode. In the example shown in FIG. 6, the anode electrode of the light-emitting element LE corresponds to a pixel electrode 171, and the cathode electrode corresponds to a common electrode 190.

The anode electrode of the light-emitting element LE is connected to a second electrode of a fifth transistor T5 and a first electrode of a sixth transistor T6, while the cathode electrode thereof may be connected to the common voltage line VSL that receives the common voltage ELVSS.

The first transistor T1 is turned on by a $k^{th}$ scan write signal of the $k^{th}$ scan write line GWLk to connect the first electrode of the driving transistor DT with the $j^{th}$ data line DLj. Accordingly, the data voltage of the $j^{th}$ data line DLj is applied to the first electrode of the driving transistor DT. A gate electrode of the first transistor T1 is connected to the $k^{th}$ scan write line GWLk, a first electrode thereof is connected to the $j^{th}$ data line DLj, and a second electrode thereof is connected to the first electrode of the driving transistor DT.

The second transistor T2 is turned on by the $k^{th}$ scan control signal of the $k^{th}$ scan control line GCLk to connect the gate electrode the driving transistor DT with the second electrode of the driving transistor DT. When the gate electrode and the second electrode of the driving transistor DT are connected with each other, the driving transistor DT works as a diode. A gate electrode of the second transistor T2 is connected to the $k^{th}$ scan control line GCLk, a first electrode thereof may be connected to the gate electrode of the driving transistor DT, and a second electrode thereof may be connected to the second electrode of the driving transistor DT.

The third transistor T3 is turned on by a $k^{th}$ scan initialization signal of the $k^{th}$ scan initialization line GILk to connect the gate electrode of the driving transistor DT with the first initialization voltage line VIL1. Accordingly, a first initialization voltage VINT1 of the first initialization voltage line VILA is applied to the gate electrode of the driving transistor DT. A gate electrode of the third transistor T3 is connected to the $k^{th}$ scan initialization line GILk, a first electrode thereof is connected to the first initialization voltage line VIL1, and a second electrode thereof is connected to the gate electrode of the driving transistor DT.

The fourth transistor T4 is turned on by a $k^{th}$ emission control signal of a $k^{th}$ emission control line ELk to connect the first electrode of the driving transistor DT with the supply voltage line VDL that receives the supply voltage ELVDD. A gate electrode of the fourth transistor T4 is connected to the k emission control line ELk, a first electrode thereof is connected to the supply voltage line VDL, and a second electrode thereof is connected to the first electrode of the driving transistor DT.

The fifth transistor T5 is turned on by the $k^{th}$ emission control signal of the $k^{th}$ emission control line ELk to connect the second electrode of the driving transistor DT with the anode electrode of the light-emitting element LE. A gate electrode of the fifth transistor T5 is connected to the $k^{th}$ emission control line ELk, a first electrode thereof is connected to the second electrode of the driving transistor DT, and a second electrode thereof is connected to the anode electrode of the light-emitting element LE.

When both the fourth transistor T4 and the fifth transistor T5 are turned on, the driving current Isd of the driving transistor DT flows to the light-emitting element LE according to the voltage of the gate electrode of the driving transistor DT.

The sixth transistor T6 is turned on by a $(k-1)^{th}$ scan signal of a $(k-1)^{th}$ scan and write line GWL(k−1) to connect the anode electrode of the light-emitting element LE with the second initialization voltage line VIL2. The second initialization voltage VAINT of the second initialization voltage line VIL2 is applied to the anode electrode of the light-emitting element LE. A gate electrode of the sixth transistor T6 is connected to the $(k-1)^{th}$ scan write line GWL(k−1), a first electrode thereof is connected to the anode electrode of the light-emitting element LE, and a second electrode thereof is connected to the second initialization voltage line VIL2.

The first capacitor Cst is formed between the gate electrode of the driving transistor DT and the supply voltage line VDL. The first capacitor electrode of the first capacitor Cst is connected to the gate electrode of the driving transistor DT, and the second capacitor electrode thereof is connected to the supply voltage line VDL.

When the first electrode of each of the driving transistor DT and the first to sixth transistors T1, T2, T3, T4, T5 and T6 is a source electrode, the second electrode thereof is a drain electrode. Alternatively, when the first electrode of each of the driving transistor DT and the first to sixth transistors T1, T2, T3, T4, T5 and T6 is a drain electrode, the second electrode thereof is a source electrode.

An active layer of each of the driving transistor DT and the first to sixth transistors T1, T2, T3, T4, T5 and T6 is formed of one of polysilicon, amorphous silicon or an oxide semiconductor. For example, the active layer of each of the driving transistor DT, the first transistor T1, and the fourth to sixth transistors T4 to T6 are made of polysilicon. The active layer of each of the second transistor T2 and the third transistor T3 are made of an oxide semiconductor. For example, the driving transistor DT, the first transistor T1, and the fourth to sixth transistors T4 to T6 are implemented as p-type MOSFETs, while the second transistor T2 and the third transistor T3 are implemented as n-type MOSFETs.

Referring to FIG. 5, in an embodiment, the circuit diagram of the subsidiary light-emitting elements SLE and the second pixel driving units PDU2 that drive them and that are disposed in the subsidiary area SA is identical to the circuit diagram of the light-emitting elements LE and the first pixel driving units PDU1 disposed in the display area DA and shown in FIG. 4, and, therefore, a repeated descriptions will be omitted Each of the plurality of photo sensors PS includes a photoelectric conversion element PD and a sensor driving unit SDU that controls a sensing current based on a photocurrent of the photoelectric conversion element PD. The sensor driving unit includes a plurality of sensing transistors LT1, LT2 and LT3 that control a sensing current generated by the photoelectric conversion element PD. The sensor driving unit SDU is connected to a reset voltage line VRL that receives a reset voltage Vrst, a second initialization voltage line VIL2 that receives second initialization voltage VAINT, and a common voltage line VSL that receives a common voltage ELVSS.

Each of the photoelectric conversion elements PD is a photodiode that includes a sensing anode electrode, a sensing cathode electrode, and a photoelectric conversion layer disposed between the sensing anode electrode and the sensing cathode electrode. Each of the photoelectric conversion elements PD converts external incident light into an electrical signal. In an embodiment, each of the photoelectric conversion elements PD is an inorganic photodiode formed of a pn-type or pin-type inorganic material, or a phototransistor. Alternatively, in an embodiment, each of the photoelectric conversion elements PD is an organic photodiode that includes an electron donating material that generates donor ions and an electron accepting material that generates acceptor ions. In the example shown in FIG. 8, the sensing anode electrodes of the photoelectric conversion elements PD correspond to the first electrodes 181 and 182, and the sensing cathode electrodes thereof correspond to the common electrode 190.

The photoelectric conversion elements PD generate photocharges when they are exposed to external light. The generated photocharges accumulate in the sensing anode electrode of each of the photoelectric conversion elements PD.

The first sensing transistor LT1 is turned on by the voltage at a first node N1 applied to the gate electrode to connect the second initialization voltage line VIL2 with a second electrode of the third sensing transistor LT3. The gate electrode of the first sensing transistor LT1 is connected to the first node N1, the first electrode thereof is connected to the second initialization voltage line VIL2, and the second electrode thereof is connected to a first electrode of the third sensing transistor LT3. The first sensing transistor LT1 generates a source-drain current in proportion to the amount of charge at the first node N1 and that is input to the gate electrode.

The second sensing transistor LT2 is turned on by a $k^{th}$ reset control signal of the $k^{th}$ reset control line RSTLk to connect the first node N1 with the reset voltage line VRL that receives the reset voltage Vrst. The gate electrode of the second sensing transistor LT2 is connected to the $k^{th}$ reset control line RSTLk, the first electrode thereof may be connected to the reset voltage line VRL, and the second electrode thereof is connected to the first node N1.

The third sensing transistor LT3 is turned on by the $k^{th}$ scan write signal of the $k^{th}$ scan write line GWLk to connect the second electrode of the first sensing transistor LT1 with a q read-out line ROLq The gate electrode of the third sensing transistor LT3 is connected to the $k^{th}$ scan write line GWLk, the first electrode thereof is connected to the second electrode of the first sensing transistor LT1, and the second electrode thereof is connected to a third node N3 and the $q^{th}$ read-out line ROLq.

An active layer of each of the first to third transistors LT1, LT2, LT3 is formed of one of polysilicon, amorphous silicon and oxide semiconductor. For example, the active layers of the first sensing transistor LT1 and the third sensing transistor LT3 may be made of polysilicon. The active layer of the second sensing transistor LT2 may be made of an oxide semiconductor. In this instance, the first sensing transistor LT1 and the third sensing transistor LT3 may be implemented as p-type MOSFETs, and the second sensing transistor LT2 may be implemented as an n-type MOSFET.

Figure 6:
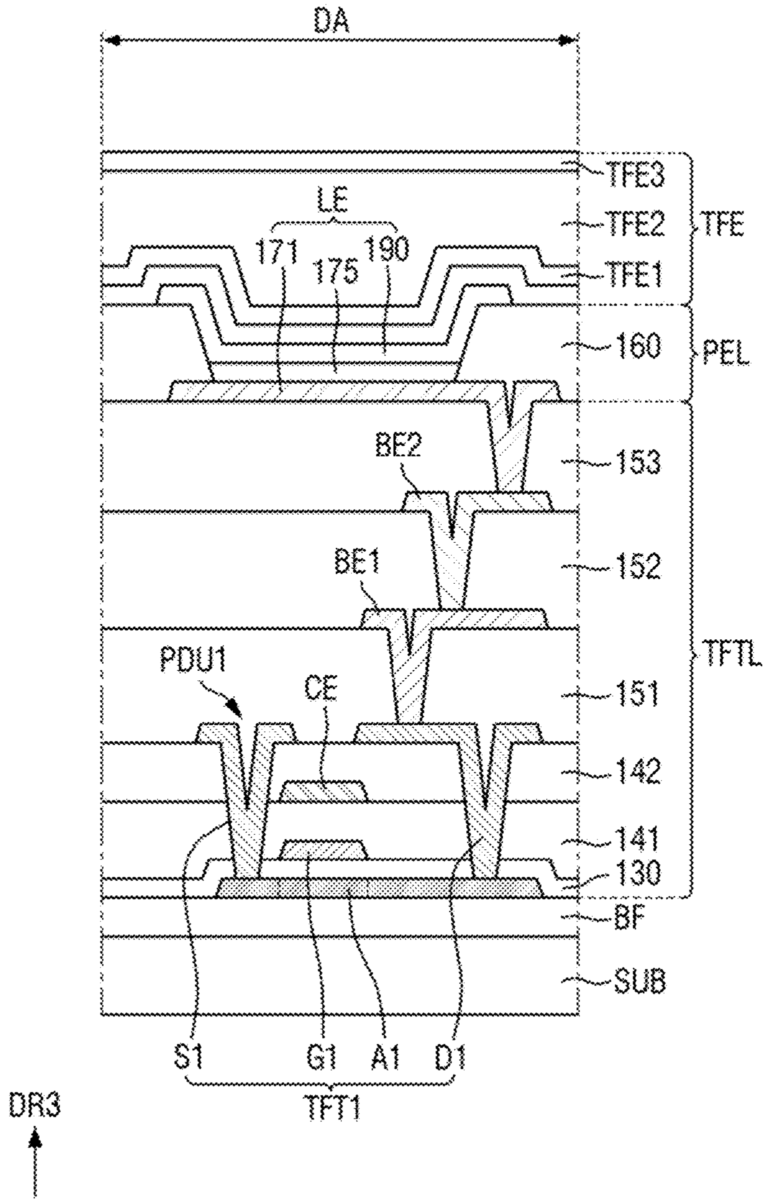
FIG. 6 is a cross-sectional view of a display device according to an exemplary embodiment of the present disclosure.
Figure 7:
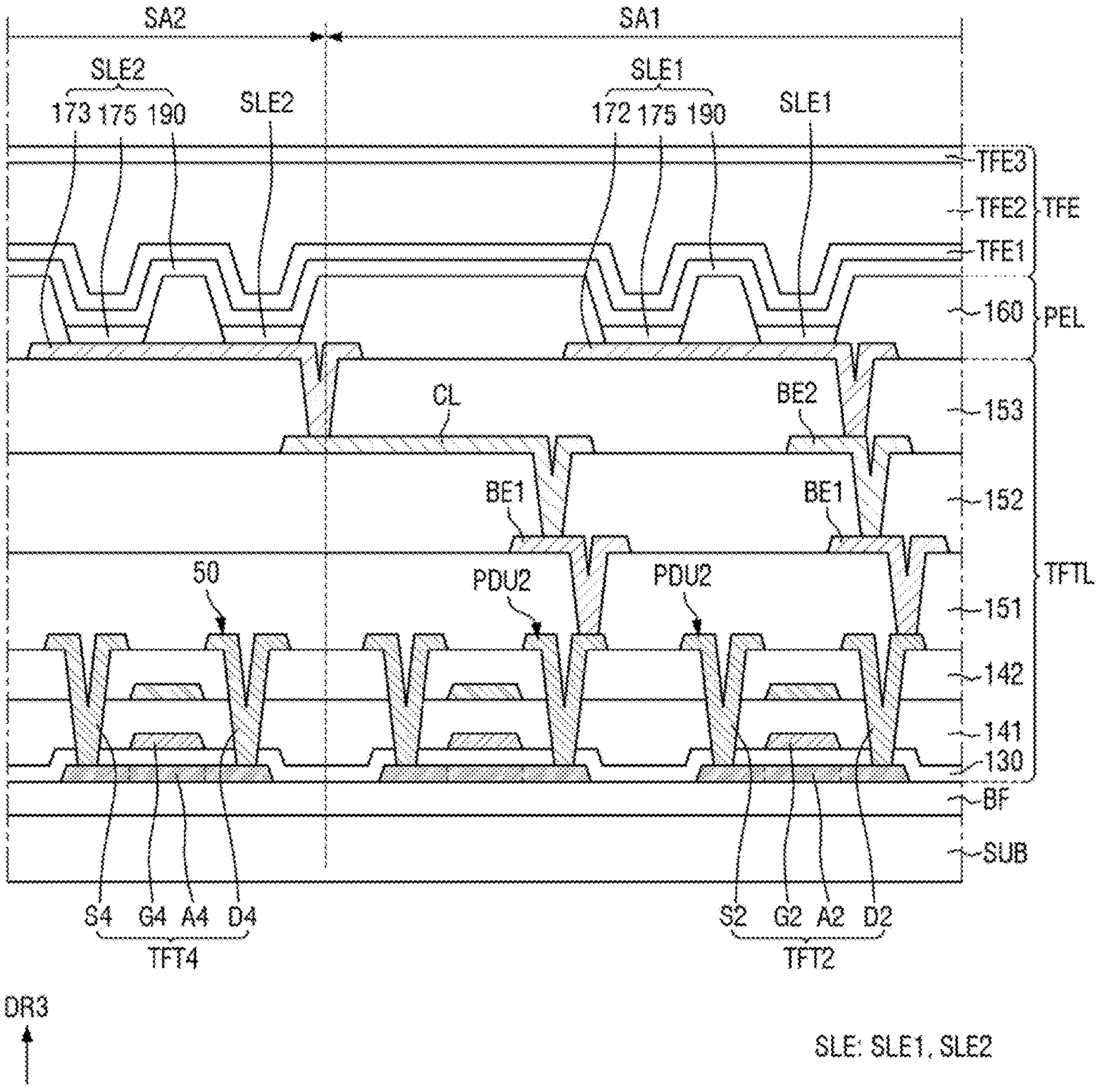
FIGS. 7 and 8 are cross-sectional views of a subsidiary area according to some embodiments of the present disclosure.
Figure 8:
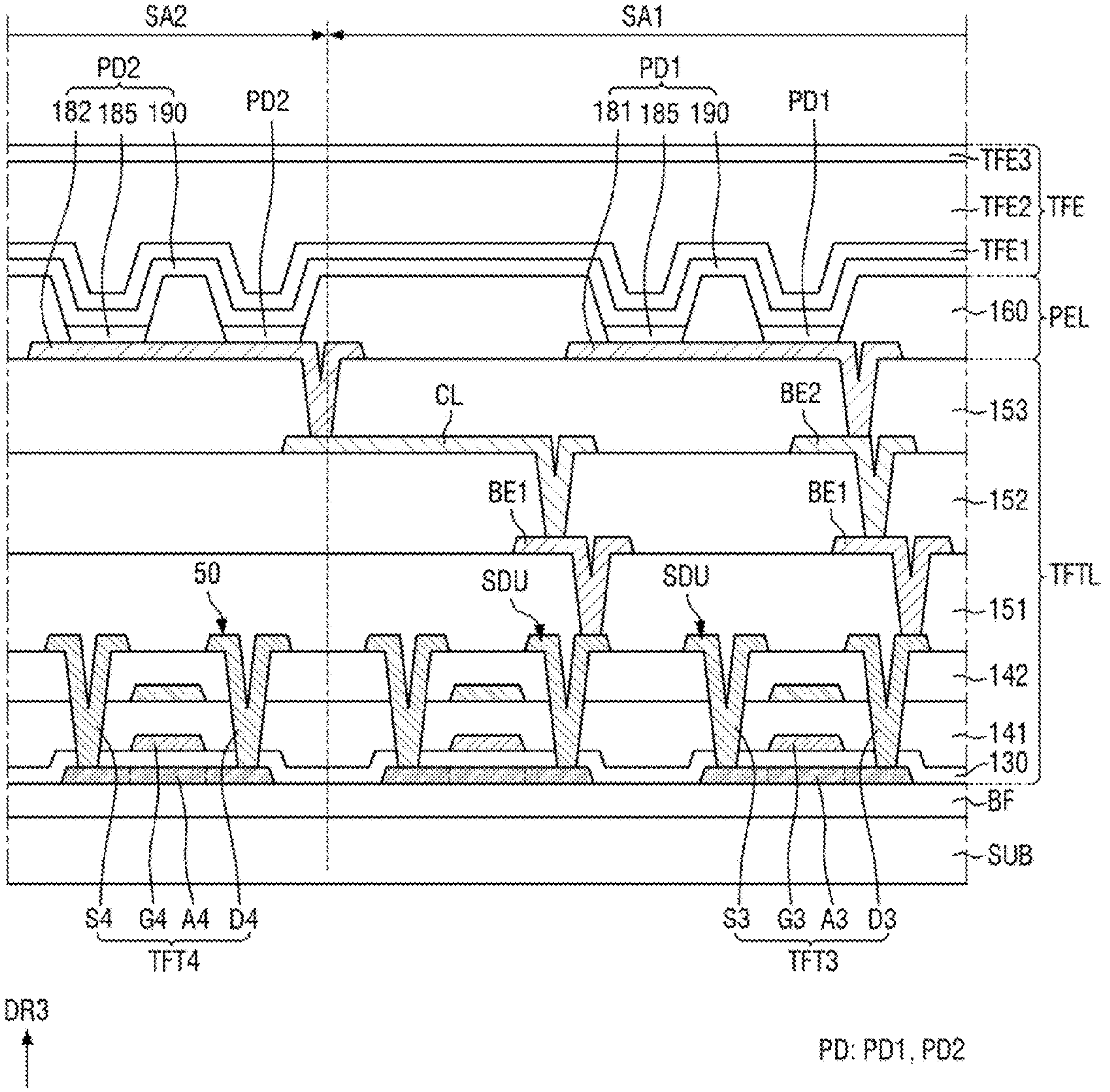

FIG. 6 is a cross-sectional view of a display device according to an exemplary embodiment of the present disclosure. FIGS. 7 and 8 are cross-sectional views of a subsidiary area according to an exemplary embodiment of the present disclosure.

Referring to FIGS. 6 to 8, in an embodiment, the display device 1 includes a substrate SUB, a thin-film transistor layer TFTL disposed on the substrate SUB, a photoelectric element layer PEL disposed on the thin-film transistor layer TFTL, and an encapsulation layer TFE disposed on the photoelectric element layer PEL. The thin-film transistor layer TFTL includes a plurality of thin-film transistors TFT1, TFT2, TFT3 and TFT4, and the photoelectric element layer PEL includes light-emitting elements LE, subsidiary light-emitting elements SLE, and photoelectric conversion elements PD.

The substrate SUB may be a rigid substrate or a flexible substrate that can be bent, folded, rolled, etc. The substrate SUB is made of an insulating material such as glass, quartz or a polymer resin.

A buffer film BF is disposed on a surface of the substrate SUB. The buffer film BF includes at least one of silicon nitride, silicon oxide, silicon oxynitride, etc.

The thin-film transistor layer TFTL disposed on the buffer film BF includes a first thin-film transistor TFT1 included in the first pixel driving unit PDU1, a second thin-film transistor TFT2 included in the second pixel driving unit PDU2, a third thin-film transistor TFT3 included in the sensor driving unit SDU, and a fourth thin-film transistor TFT4 included in the scan driver 50. The first thin-film transistor TFT1 may be one of the transistors DT and T1 to T6 of FIG. 4. The second thin-film transistor TFT2 may be one of the transistors DT and T1 to T6 of FIG. 5. The third thin-film transistor TFT3 may be one of the sensing transistors LT1 to LT3 of FIG. 5.

The semiconductor layers A1, A2, A3 and A4 of the plurality of thin-film transistors TFT1, TFT2, TFT3 and TFT4 are disposed on the buffer film BF. The semiconductor layers A1, A2, A3 and A4 include polycrystalline silicon. However, embodiments are not necessarily limited thereto, and in some exemplary embodiments, the semiconductor layers A1, A2, A3 and A4 include one or more of monocrystalline silicon, low-temperature polycrystalline silicon, amorphous silicon, or an oxide semiconductor. Each of the semiconductor layers A1, A2, A3 and A4 includes a channel region, and a source region and a drain region doped with impurities.

A gate insulating layer 130 is disposed on the semiconductor layers A1, A2, A3 and A4. The gate insulating layer 130 electrically insulates the gate electrodes G1, G2, G3 and G4 of the thin film transistors TFT1, TFT2, TFT3 and TFT4 from the respective semiconductor layers A1, A2, A3 and A4. The gate insulating layer 130 is made of an insulating material, such as silicon oxide (SiOx), silicon nitride (SiNx), or a metal oxide, etc.

The gate electrodes G1, G2, G3 and G4 of the thin-film transistors TFT1, TFT2 TFT3 and TFT4 are disposed on the gate insulating layer 130. The gate electrodes G1, G2, G3 and G4 are formed above the channel regions of the semiconductor layers A1, A2, A3 and A4, respectively, and on the gate insulating layer 130 such that they overlap the channel regions. The gate electrodes G1, G2, G3 and G4 include one or more of molybdenum (Mo), aluminum (Al), copper (Cu), or titanium (Ti), etc., and may be have a single layer or include multiple layers.

A first interlayer dielectric layer 141 may be disposed on the gate electrodes G1, G2, G3 and G4 and the gate insulating layer 130. The first interlayer dielectric layer 141 includes an inorganic insulating material such as one or more of silicon oxide (SiOx), silicon nitride (SiNx), silicon oxynitride, hafnium oxide or aluminum oxide.

An upper capacitor electrode CE of the first capacitor Cst (see FIG. 4) is disposed on the first interlayer dielectric layer 141. The upper capacitor electrode CE overlap the gate electrodes G1 and G2. The upper capacitor electrode CE, the gate electrodes G1 and G2, and the first interlayer dielectric layer 141 therebetween form the first capacitor Cst.

A second interlayer dielectric layer 142 is disposed on the upper capacitor electrode CE and the first interlayer dielectric layer 141. The second interlayer dielectric layer 142 includes an inorganic insulating material such as at least one of silicon oxide (SiOx), silicon nitride (SiNx), silicon oxynitride, hafnium oxide or aluminum oxide.

Source electrodes S1, S2, S3 and S4 and drain electrodes D1, D2, D3 and D4 of the thin-film transistors TFT1, TFT2, TFT3 and TFT4 are disposed on the second interlayer dielectric layer 142. The source electrodes S1, S2, S3 and S4 and the drain electrodes D1, D2, D3 and D4 are electrically connected to the source regions and drain regions of the semiconductor layers A1, A2, A3 and A4 through contact holes that penetrate through the insulating layers 130, 141 and 142. The source electrodes S1, S2, S3 and S4 and the drain electrodes D1, D2, D3 and D4 include at least one of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) or copper (Cu).

A first planarization layer 151 is disposed on the second interlayer dielectric layer 142 and covers the source electrodes S1, S2, S3 and S4 and the drain electrodes D1, D2, D3 and D4. The first planarization layer 151 is made of an organic insulating material, etc. The first planarization layer 151 has a flat surface.

First bridge electrodes BE1 are disposed on the first planarization layer 151. Each of the first bridge electrodes BE1 is connected to one of the source electrodes S1, S2, S3 and S4 or the drain electrodes D1, D2, D3 and D4 through a contact hole that penetrates through the first planarization layer 151. The first bridge electrodes BE1 include at least one of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) or copper (Cu).

A second planarization layer 152 is disposed on the first planarization layer 151 and covers the first bridge electrodes BEL, The second planarization layer 152 is made of an organic insulating material, etc.

Second bridge electrodes BE2 and connection lines CL are disposed on the second planarization layer 152. The second bridge electrodes BE2 and the connection lines CL are connected to the first bridge electrodes BE1 through contact holes that penetrate through the second planarization layer 152.

The second bridge electrodes BE2 connect the first pixel driving units PDU1 with the light-emitting elements LE in the display area DA, connect the second pixel driving units PDU2 with the first subsidiary light-emitting elements SLE1, and connect the sensor driving units SDU with the first photoelectric conversion elements in the first subsidiary area SA1. The second bridge electrodes BE2 are disposed in the display area DA and the first subsidiary area SA1.

The connection lines CL extend from the first subsidiary area SA1 to the second subsidiary area SA2. The connection lines CL connect the second pixel driving units PDU2 with the second subsidiary light-emitting elements SLE2 and connect the sensor driving units SDU with the second photoelectric conversion elements PD2. The connection line CL are disposed across the first subsidiary area SA1 and the second subsidiary area SA2.

The second bridge electrode BE2 and the connection line CL include at least one of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) or copper (Cu).

A third planarization layer 153 is disposed on the second planarization layer 152 and covers the second connection electrode BE2 and the connection line CL. The third planarization layer 153 is made of an organic insulating material, etc.

The light-emitting elements LE, the subsidiary light-emitting elements SLE, the photoelectric conversion elements PD and the pixel-defining film 160 of the photoelectric element layer PEL are disposed on the third planarization layer 153. The light-emitting element LE and the subsidiary light-emitting elements SLE include the pixel electrodes 171, 172 and 173, the emissive layer 175, and the common electrode 190. The photoelectric conversion elements PD include the first electrodes 181 and 182, the photoelectric conversion layer 185, and the common electrode 190. The light-emitting elements LE and the photoelectric conversion elements PD share the common electrode 190.

The pixel electrodes 171, 172 and 173 of the light-emitting elements LE and the subsidiary light-emitting elements SLE are disposed on the third planarization layer 153. The pixel electrodes 171, 172 and 173 are disposed in the pixels, respectively. The pixel electrodes 171 and 172 are connected to the second bridge electrodes BE2 through contact holes that penetrate through the third planarization layer 153. The pixel electrode 173 located in the second subsidiary area SA2 is connected to the connection line CL through a contact hole that penetrates through the third planarization layer 153. However, in some embodiments, the display device 1 does not include the connection line CL, and the pixel electrode 173 extends to the first subsidiary area SA1 to be connected to the second pixel driving unit PDU2.

The pixel electrodes 171, 172 and 173 may have, but are not necessarily limited to, a single-layer structure of molybdenum (Mo), titanium (Ti), copper (Cu) or aluminum (Al), or a multi-layer structure of ITO/Mg, ITO/MgF, ITO/Ag or ITO/Ag/ITO that include indium-tin-oxide (ITO), indium-zinc-oxide (IZO), zinc oxide (ZnO), indium oxide ($In_2O_3$), silver (Ag), magnesium (Mg), aluminum (Al), platinum (Pt), lead (Pb), gold (Au) and nickel (Ni).

In addition, the first electrodes 181 and 182 of the photoelectric conversion elements PD are disposed on the third planarization layer 153. The first electrodes 181 and 182 are disposed in photo sensors, respectively. The first electrode 181 is located in the first subsidiary area SA1 and is connected to the second bridge electrode BE2 through a contact hole that penetrates the third planarization layer 153. The first electrode 182 is located in the second subsidiary area SA2 and is connected to the connection line CL through a contact hole that penetrates through the third planarization layer 153. However, in some embodiments, the display device 1 does not include the connection lines CL, and the first electrode 182 extends to the first subsidiary area SA1 to be connected to the second pixel driving units PDU2.

The first electrodes 181 and 182 of the photoelectric conversion elements PD may have, but are not limited to, a single-layer structure of molybdenum (Mo), titanium (Ti), copper (Cu) and aluminum (Al), or a multi-layer structure of ITO/Mg, ITO/MgF, ITO/Ag and ITO/Ag/ITO.

The pixel-defining film 160 is disposed on the third planarization layer 153 and covers the pixel electrodes 171, 172 and 173 and the first electrodes 181 and 182. The pixel-defining film 160 includes openings that overlap the pixel electrodes 171, 172 and 173 and exposes the pixel electrodes 171, 172 and 173. In addition, the pixel-defining film 160 includes openings that overlap the first electrodes 181 and 182 and exposes the first electrodes 181 and 182. A part of the pixel-defining film 160 is in contact with the upper surface of the pixel electrodes 171, 172 and 173 and the first electrodes 181 and 182.

The pixel-defining film 160 include an organic insulating material such as a polyacrylate resin, an epoxy resin, a phenolic resin, a polyamide resin, a polyimide resin, an unsaturated polyesters resin, a poly phenylen ether resin, a poly phenylene sulfide resin, or benzocyclobutene (BCB).

The emissive layer 175 is disposed on the pixel electrodes 171, 172 and 173 exposed through the openings of the pixel-defining film 160. The emissive layer 175 includes a high-molecular weight material or a low-molecular weight material, and may emit one of red, green or blue light from the pixels, respectively. The light emitted from the emissive layer 175 contributes to image display or function as a light source for light incident on the photo sensors PS.

When the emissive layer 175 is formed of an organic material, a hole injecting layer HIL and a hole transporting layer HTL are disposed under each emissive layer 175, and an electron injecting layer EIL and an electron transporting layer ETL are disposed on it. These may have a single-layer or a multi-layer structure that includes an organic material.

The photoelectric conversion layer 185 is disposed on the first electrodes 181 and 182 of the photoelectric conversion elements PD exposed through the openings of the pixel-defining film 160. The photoelectric conversion layer 185 generates photocharges in proportion to the incident light. The incident light may be light that was emitted from the emissive layer 175 and reflected, or may be external light that was not emitted by the emissive layer 175. Charges generated and accumulated in the photoelectric conversion layer 185 are converted into electrical signals for sensing.

The photoelectric conversion layer 185 includes electron donors and electron acceptors. The electron donors generate donor ions in response to light, and the electron acceptors generate acceptor ions in response to light. When the photoelectric conversion layer 185 is formed of an organic material, the electron donors include, but are not necessarily limited to, a compound such as subphthalocyanine (SubPc) or dibutylphosphate (DBP). The electron acceptors include, but are not necessarily limited to, a compound such as fullerene, a fullerene derivative, or perylene diimide.

The common electrode 190 is disposed on the emissive layer 175, the photoelectric conversion layer 185 and the pixel-defining film 160. The common electrode 190 is disposed across the plurality of pixels and the plurality of photo sensors such that it covers the emissive layer 175, the photoelectric conversion layer 185 and the pixel-defining film 160. The common electrode 190 includes a low-work function conductive material, such as Li, Ca, LiF/Ca, LiF/Al, Al, Mg, Ag, Pt, Pd, Ni, Au, Nd, Ir, Cr, BaF, Ba, or a compound or mixture thereof, such as a mixture of Ag and Mg. Alternatively, in an embodiment, the common electrode CE includes a transparent metal oxide, such as one of indium-tin-oxide (ITO), indium-zinc-oxide (IZO), zinc oxide (ZnO), etc.

The regions where the pixel electrodes 171, 172 and 173, the emissive layer 175 and the common electrode 190 overlap each other may be defined as the light-emitting areas of the light-emitting elements LE and the subsidiary light-emitting elements SLE. The regions where the first electrodes 181 and 182, the photoelectric conversion layer 185 and the common electrode 190 overlap each other may be defined as the light-receiving areas of the photoelectric conversion elements PD.

According to an exemplary embodiment, the light-emitting areas of the light-emitting elements LE overlap the first pixel driving units PDU1 connected thereto. The light-emitting areas of the first subsidiary light-emitting elements SLE1 may overlap the second pixel driving units PDU2 connected thereto, or may overlap the second pixel driving units PDU2 connected to the second subsidiary light-emitting elements SLE2. The light-emitting areas of the second subsidiary light-emitting elements SLE2 do not overlap the second pixel driving units PDU2 connected thereto, but overlap the scan driver 50. In addition, the light-receiving areas of the first photoelectric conversion elements PD1 overlap the sensor driving units SDU connected thereto, or overlap the sensor driving units SDU connected to the second photoelectric conversion elements PD2. The light-receiving areas of the second photoelectric conversion elements PD2 do not overlap the sensor driving units SDU connected thereto, but overlap the scan driver 50. For example, the photoelectric conversion elements PD and the sensor driving units SDU are spaced apart from each other.

One first pixel driver PDU1 is connected to one light-emitting element LE. One second pixel driving unit PDU2 is connected to the plurality of subsidiary light-emitting elements SLE. Referring to FIG. 7, in an embodiment, two first subsidiary light-emitting elements SLE1 or two second subsidiary light-emitting elements SLE2 are connected to each second pixel driving unit PDU2. The plurality of subsidiary light-emitting elements SLE connected to one second pixel driving unit PDU2 emit light of the same color. For example, two first subsidiary light-emitting elements SLE1 connected to a second thin-film transistor TFT2 emit one of red, green or blue light.

In addition, one sensor driving unit SDU is connected to a plurality of photoelectric conversion elements PD. Referring to FIG. 8, in an embodiment, two first photoelectric conversion elements PD1 or two second photoelectric conversion elements PD2 are connected to each of the sensor driving units SDU. The plurality of photoelectric conversion elements PD connected to one sensor driving unit SDU generate the same sensing current.

The encapsulation layer TFE is disposed on the photoelectric element layer PEL. The encapsulation layer TFE includes at least one inorganic film and one organic film that protect each of the emissive layer 175 and the photoelectric conversion layer 185 from permeation of oxygen or moisture or particles such as dust. For example, the encapsulation layer TFE has a stack structure of a first inorganic film TFE1 disposed on the common electrode 190, an organic film TFE2 disposed on the first inorganic film TFE1 and a second inorganic film TFE3 disposed on the organic film TFE2.

Figure 9A:
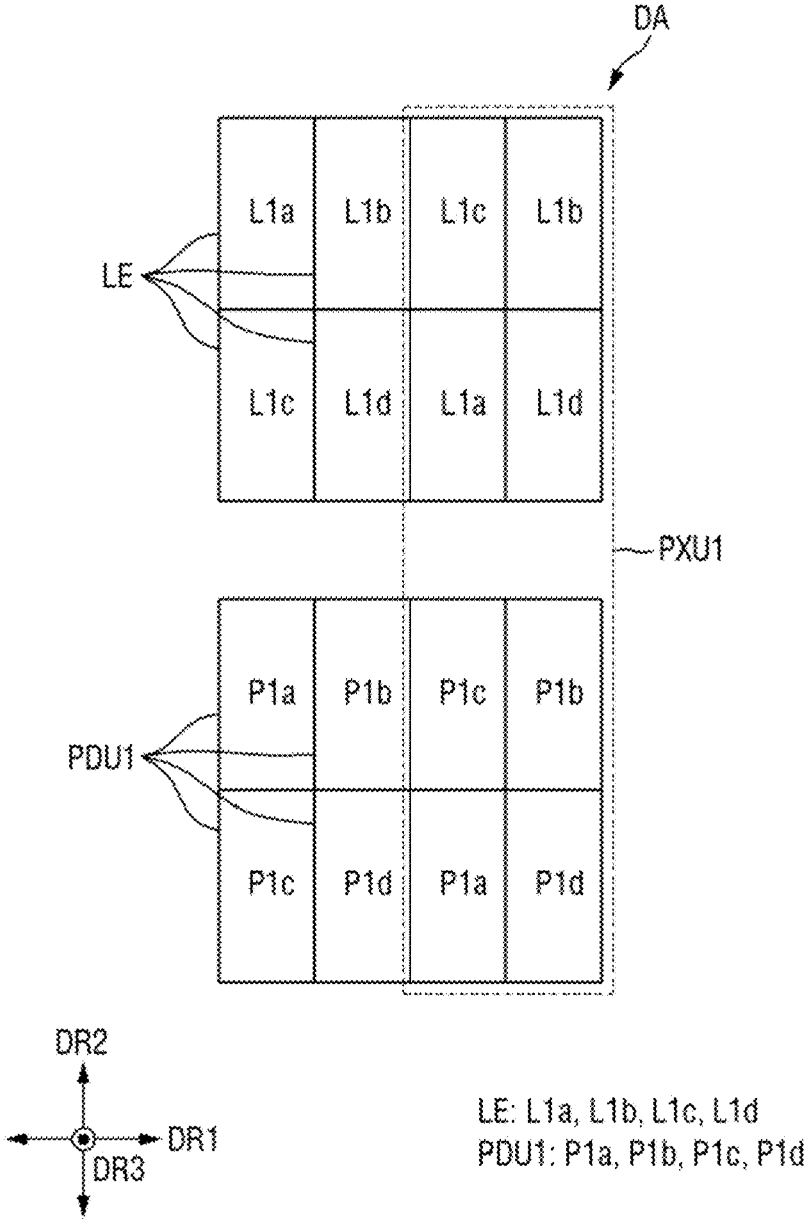
FIG. 9A is a plan view of an arrangement relationship between first pixel driving units and light-emitting elements of a display device according to an exemplary embodiment.
Figure 9B:
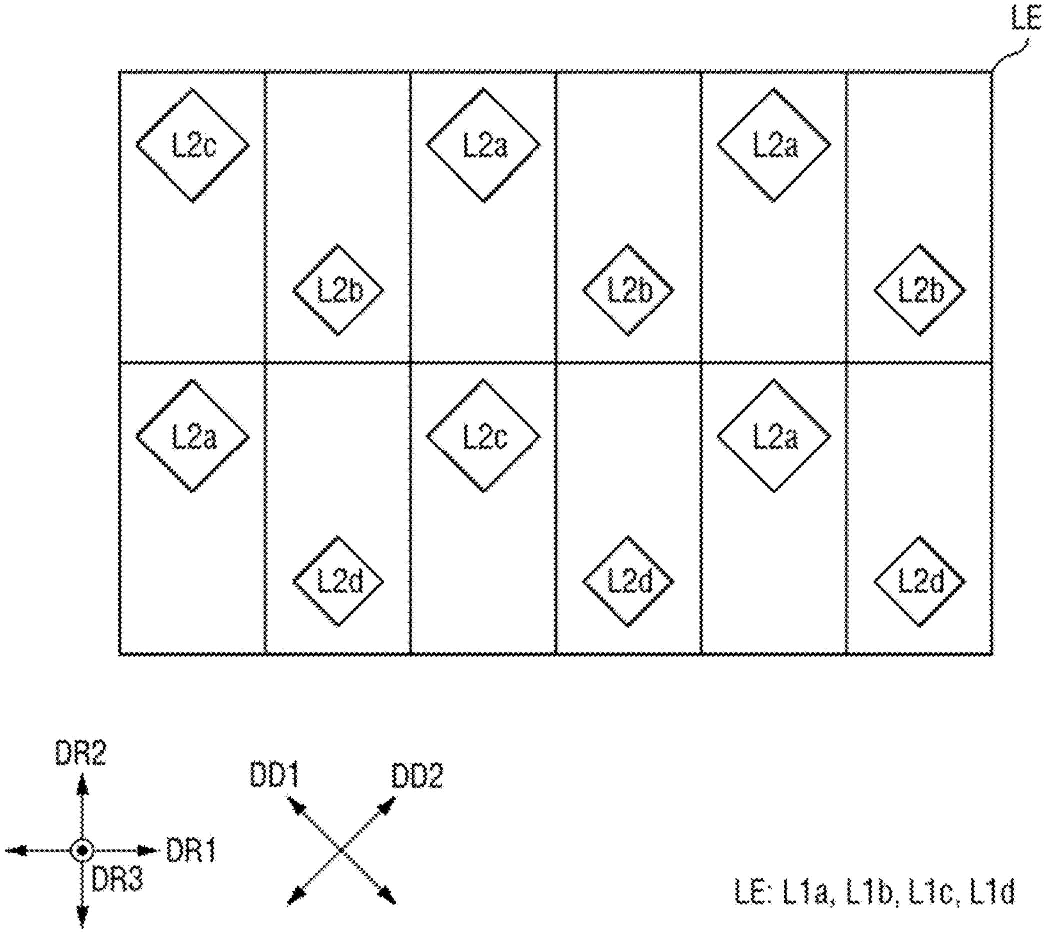
FIG. 9B is an enlarged plan view of an arrangement relationship of light-emitting elements of FIG. 9A.

FIG. 9A is a plan view of arrangement relationships between first pixel driving units and light-emitting elements of a display device according to an exemplary embodiment. FIG. 9B is an enlarged plan view of an arrangement relationship of the light-emitting elements of FIG. 9A.

Although the first pixel driving units PDU1 and the light-emitting elements LE are separately depicted in FIG. 9A for ease of illustration, the light-emitting elements LE may overlap the first pixel driving units PDU1.

Referring to FIG. 9A, in an embodiment, light-emitting elements LE are arranged in the first direction DR1 and the second direction DR2 in the display area DA. In the display area DA, the first pixel driving units PDU1 are arranged in the first direction DR1 and the second direction DR2. The first pixel driving units PDU1 arranged in the first direction DR1 are connected to the same scan line SL (see FIG. 2), and the first pixel driving units PDU1 arranged in the second direction DR2 are connected to the same data line DL (see FIG. 2).

The light-emitting elements LE include first color light-emitting elements L1*a*, second color light-emitting elements L1*b*, third color light-emitting elements L1*c*, and fourth color light-emitting elements L1*d*. Each of the first color light-emitting elements L1*a*, the second color light-emitting elements L1*b*, the third color light-emitting elements L1*c* and the fourth color light-emitting elements L1*d* emits light of a predetermined color. For example, the first color light-emitting elements L1*a* emits red light, and the third color light-emitting elements L1*c* emits blue light. The second color light-emitting elements L1*b* and the fourth color light-emitting elements L1*d* emit green light.

Referring to FIG. 9B, in an embodiment, the color light-emitting elements L2*a*, L2*b*, L2*c* and L2*d* are adjacent to each other in the first direction DR1 and the second direction DR2. For example, the first color light-emitting elements L2*a* and the second color light-emitting elements L2*b* are adjacent to each other in the first direction DR1, and the third color light-emitting elements 12*c* and the fourth color light-emitting elements L2*d* are adjacent to each other in the first direction DR1. The first color light-emitting elements L2*a* and the third color light-emitting elements L2*c* are adjacent to each other in the second direction DR2, and the second color light-emitting elements L2*b* and the fourth color light-emitting elements L2*d* are adjacent to each other in the second direction DR2.

The emission areas of the color light-emitting elements L2*a*, L2*b*, L2*c* and L2*d* are adjacent to each other in diagonal directions DD1 and DD2 between the first direction DR1 and the second direction DR2. For example, the first color light-emitting elements L2*a* and the second color light-emitting elements L2*b* are adjacent to each other in the first diagonal direction DD1. The third color light-emitting elements L2*c* and the fourth color light-emitting elements L2*d* are adjacent to each other in the first diagonal direction DD1.

Referring back to FIG. 9A, in an embodiment, the first pixel driving units PDU1 include first color pixel driving units P1*a*, second color pixel driving units P1*b*, third color pixel driving units Plc, and fourth color pixel driving units P1*d*. The first color pixel driving units P1*a* are connected to the first color light-emitting elements L1*a*, and the first color light-emitting elements L1*a* overlap the first color pixel driving units P1*a*. The second color pixel driving units P1*b* are connected to the second color light-emitting elements L1*b*, and the second color light-emitting elements L1*b* overlap the second color pixel driving units P1*b*. The third color pixel driving units P1*c* are connected to the third color light-emitting elements L1*c*, and the third color light-emitting elements L1*c* overlap the third color pixel driving units P1*c*. The fourth color pixel driving units P1*d* are connected to the fourth color light-emitting elements L1*d*, and the fourth color light-emitting elements L1*d* overlap the fourth color pixel driving units P1*d*. For example, the light-emitting elements LE overlap the first pixel driving units PDU1 connected thereto. The first color pixel driving unit P1*a* and the second color pixel driving unit P1*b* are adjacent to each other in the first direction DR1, and the third color pixel driving unit P1*c* and the fourth color pixel driving unit P1*d* are adjacent to each other in the first direction DR1. The first color pixel driving unit P1*a* and the third color pixel driving unit P1*c* are adjacent to each other in the second direction DR2, and the second color pixel driving unit P1*b* and the fourth color pixel driving unit P1*d* are adjacent to each other in the second direction DR2.

Four color pixel circuits P1*a*, P1*b*, P1*c* and P1*d* and four color light-emitting elements L1*a*, L1*b*, L1*c* and L1*d* form a single first pixel unit PXU1. In the display area DA, a plurality of pixel groups are repeatedly arranged in the first direction DR1 and the second direction DR2.

Figure 10:
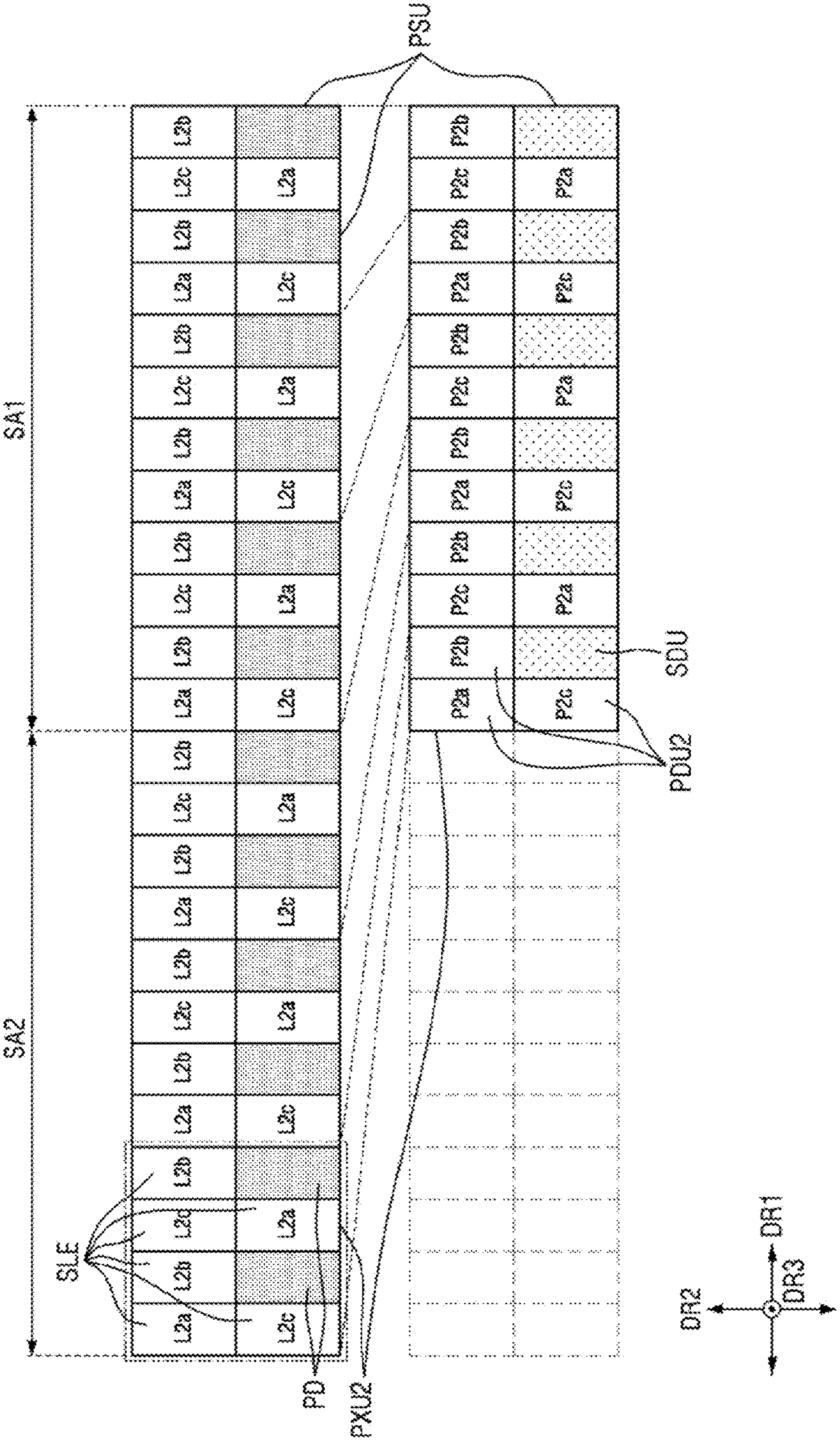
FIG. 10 is a plan view of arrangement relationships between second pixel driving units, second driving units, subsidiary light-emitting elements and photoelectric conversion elements of a display device according to an exemplary embodiment.
Figure 11:
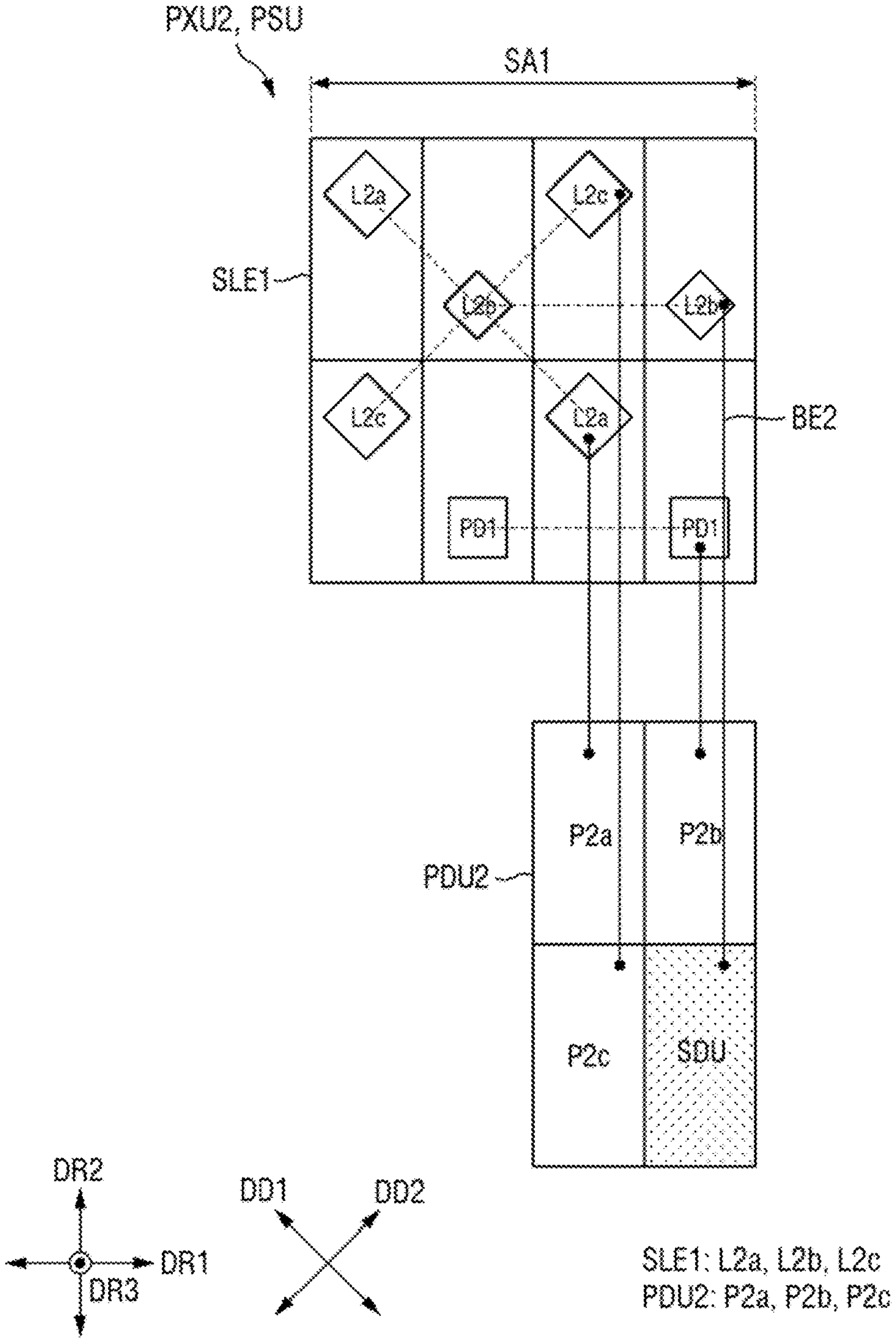
FIG. 11 is an enlarged plan view of arrangement relationships between the second pixel driving units, the second driving units, the first subsidiary light-emitting elements and the photoelectric conversion elements of FIG. 10.
Figure 12:
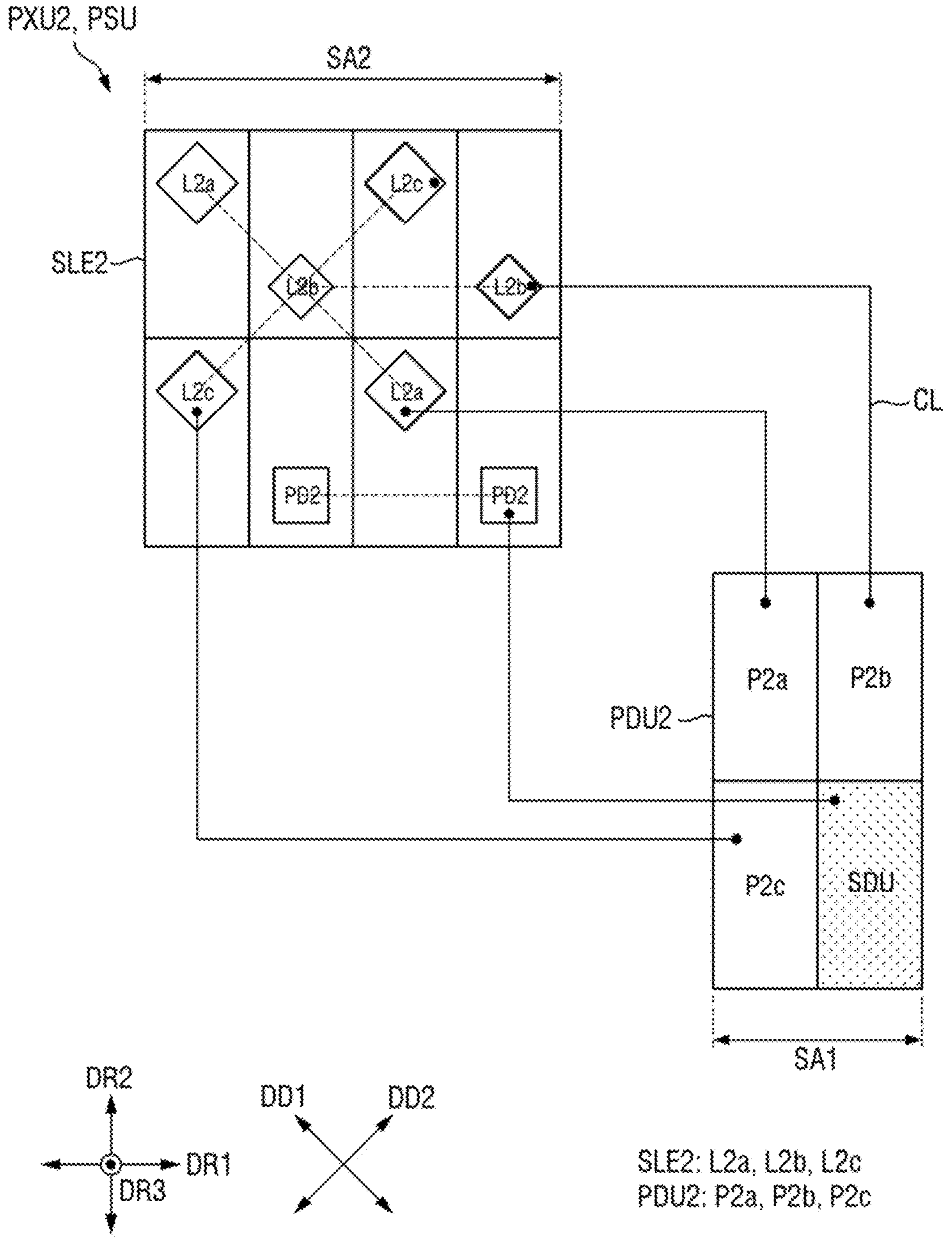
FIG. 12 is an enlarged plan view of arrangement relationships between the second pixel driving units, the second driving units, the second subsidiary light-emitting elements and the photoelectric conversion elements of FIG. 10.

FIG. 10 is a plan view of arrangement relationships between second pixel driving units, second driving units, subsidiary light-emitting elements and photoelectric conversion elements of a display device according to an exemplary embodiment. FIG. 11 is an enlarged plan view of arrangement relationships between the second pixel driving units, the second driving units, the first subsidiary light-emitting elements and the photoelectric conversion elements of FIG. 10. FIG. 12 is an enlarged plan view of arrangement relationships between the second pixel driving units, the second driving units, the second subsidiary light-emitting elements and the photoelectric conversion elements of FIG. 10.

Although the second pixel driving units PDU2 and the subsidiary light-emitting elements SLE are separately depicted in FIGS. 10 to 12 for convenience of illustration, the subsidiary light-emitting elements SLE may overlap the second pixel driving units PDU2. In addition, for convenience of illustration, although the sensor driving units SDU and the photoelectric conversion elements PD are separately depicted in the drawings, the photoelectric conversion elements PD may overlap the sensor driving units SDU.

Referring to FIGS. 10 to 12, in an embodiment, each second pixel driver PDU2 is connected to two subsidiary light-emitting elements SLE, and each sensor driving unit SDU is connected to two photoelectric conversion elements PD.

In the subsidiary area SA, the subsidiary light-emitting elements SLE and the photoelectric conversion elements PD are arranged in the first direction DR1 and the second direction DR2. In addition, in the subsidiary area SA, the second pixel driving units PDU2 and the sensor driving units SDU are arranged in the first direction DR1 and the second direction DR2. The second pixel driving units PDU2 and the sensor driving units SDU arranged in the first direction DR1 are connected to the same scan line SL, and the second pixel driving units PDU2 and the sensor driving units SDU arranged in the second direction DR2 are connected to the same data line DL.

The subsidiary light-emitting elements SLE include first color light-emitting elements L2*a*, second color light-emitting elements L2*b*, and third color light-emitting elements L2*c*. Each of the first color light-emitting elements L2*a*, the second color light-emitting elements L2*b*, and the third color light-emitting elements L2*c* emits light of a predetermined color. For example, the first color light-emitting elements L2*a* emit red light, the second color light-emitting elements L2*b* emit green light, and the third color light-emitting elements L2*c* emit blue light. The photoelectric conversion elements PD generate a photocurrent by sensing the light emitted from the subsidiary light-emitting elements SLE. The photoelectric conversion elements PD are formed at the positions of the fourth color light-emitting elements L2*d* of FIG. 9B.

In the first row, a first color light-emitting element L2*a*, a second color light-emitting element L2*b*, a third color light-emitting element L2*c*, and a second color light-emitting element L2*b* are arranged sequentially in the first direction DR1. In the second row, a third color light-emitting element L2*c*, a photoelectric conversion element PD, a first color light-emitting element L2*a*, and a photoelectric conversion element PD are arranged sequentially in the first direction DR1. The first color light-emitting element L2*a* and the third color light-emitting element L2*c* are adjacent to each other in the second direction DR2, and the second color light-emitting element L2*b* and the photoelectric conversion element PD are adjacent to each other in the second direction DR2.

Referring to FIGS. 11 and 12, in some embodiments, the light-emitting areas of the color light-emitting elements L2*a*, L2*b* and L2*c* and the light-receiving areas of the photoelectric conversion elements PD1 and PD2 are adjacent to each other in the diagonal directions DD1 and DD2. For example, the first color light-emitting element L2*a* and the second color light-emitting elements L2*b* are adjacent to each other in the first diagonal direction DD1. The third color light-emitting elements L2*c* and the photoelectric conversion elements PD1 and PD2 are adjacent to each other in the first diagonal direction DD1.

Referring back to FIG. 10, in an embodiment, the arrangement relationship of the second pixel driving units PDU2 and the sensor driving units SDU will be described. The second pixel driving units PDU2 include first color pixel driving units P2*a*, second color pixel drive units P2*b*, and third color pixel driving units P2*c*. Each of the first color pixel driving units P2*a* is connected to two first color light-emitting elements L2*a*. Each of the second color pixel driving units P2*b* is connected to two second color light-emitting elements L2*b*. Each of the third color pixel driving units P2*c* is connected to two third color light-emitting elements L2*c*. Each of the sensor driving units SDU is connected to two photoelectric conversion elements PD.

Referring to FIGS. 10 and 11, in some embodiment, a first subsidiary light-emitting element SLE1 disposed in the first subsidiary area SA1 is connected to a second pixel driving unit PDU2 via a second bridge electrode BE2. Some of the first subsidiary light-emitting elements SLE1 overlap the second pixel driving units PDU2 connected thereto, while other first subsidiary light-emitting elements SLE1 overlap the second pixel driving units PDU2 not connected thereto.

In addition, the first photoelectric conversion elements PD1 disposed in the first subsidiary area SA1 are connected to the sensor driving units SDU through the second bridge electrodes BE2. Some of the first photoelectric conversion elements PD1 overlap the sensor driving units SDU connected thereto, while other first photoelectric conversion elements PD1 overlap the sensor driving units SDU not connected thereto. For example, in FIG. 11, the first of the first photoelectric conversion elements PD1 from the right overlaps the sensor driving unit SDU connected thereto, while the second of the first photoelectric conversion elements PD1 from the right overlaps a sensor driving unit that is not connected thereto.

Referring to FIGS. 10 and 12, in some embodiments, second subsidiary light-emitting elements SLE2 disposed in the second subsidiary area SA1 are connected to the second pixel driving units PDU2 via connection lines CL. The connection lines CL extend across the first subsidiary area SA1 and the second subsidiary area SA2. The second subsidiary light-emitting elements SLE2 do not overlap the second pixel driving units PDU2. In addition, the second photoelectric conversion elements PD2 disposed in the second subsidiary area SA2 are connected to the sensor driving units SDU through the connection lines CL. The second photoelectric conversion elements PD2 do not overlap the sensor driving units SDU connected thereto.

The first color pixel driving unit P2*a* and the second color pixel driving unit P2*b* are adjacent to each other in the first direction DR1, and the third color pixel driving unit P2*c* and the sensor driving unit SDU are adjacent to each other in the first direction DR1. The first color pixel driving unit P2*a* and the third color pixel driving unit P2*c* are adjacent to each other in the second direction DR2, and the second color pixel driving unit P2*b* and the sensor driving unit SDU are adjacent to each other in the second direction DR2.

The two first color light-emitting elements L2*a* connected to the first color pixel driver P2*a* are disposed along the first diagonal direction DD1 between the first direction DR1 and the second direction DR2. For example, the two first color light-emitting elements L2*a* adjacent to each other in the first diagonal direction DD1 are connected to each other and receive the same driving current and exhibit the same luminance. Two second color light-emitting elements L2*b* connected to the second color pixel driving unit P2*b* are arranged in the first direction DR1. For example, two second color light-emitting elements L2*b* adjacent to each other in the first direction DR1 are connected to each other and receive the same driving current and exhibit the same luminance. Two third color light-emitting elements L2*c* connected to the third color pixel driving unit P2*c* are arranged in a second diagonal direction DD2 that crosses the first diagonal direction DD1. For example, the two third color light-emitting elements L2*c* adjacent to each other in the second diagonal direction DD2 are connected to each other and receive the same driving current and exhibit the same luminance. For example, three color light-emitting elements L2*a*, L2*b* and L2*c* are connected by the extended pixel electrodes 172 and 173 of the photoelectric element layer PEL (see FIG. 7).

Two photoelectric conversion elements PD1 and PD2 connected to the sensor driving unit SDU are arranged along the first direction DR1. For example, two photoelectric conversion elements PD1 and PD2 adjacent to each other in the first direction DR1 are connected to each other and are controlled by the same sensing current. For example, two photoelectric conversion elements PD1 and PD2 are connected to each other by the extended first electrodes 181 and 182 of the photoelectric element layer PEL.

Although two adjacent color light-emitting elements L2*a*, L2*b* and L2*c* and two photoelectric conversion elements PD1 and PD2 are connected to each other in the drawings, embodiments are not necessarily limited thereto, and in some embodiments, two or more of them are connected to one driving unit.

One of the two subsidiary light-emitting elements SLE that are connected to each other and exhibits the same color and luminance is referred to as a copy light-emitting element. By forming the copy light-emitting element as described above, the size of the light-emitting area of the subsidiary light-emitting elements SLE is substantially equal to the size of the light-emitting area of the light-emitting elements LE, which prevents the resolution and/or luminance in the subsidiary area SA from being lower than that of the display area DA.

Likewise, one of the two photoelectric conversion elements PD that are connected to each other and generates the same sensing current is referred to as a copy photoelectric conversion element. By forming the copy photoelectric conversion element, light sensing that identifies a user's fingerprint by sensing outside light in the subsidiary area SA is possible. Accordingly, the display device 1 that can sense light without compromising the resolution of the display area DA can be implemented.

In some embodiments, three color pixel driving units P2*a*, P2*b* and P2*c* and six color light-emitting elements L2*a*, L2*b* and L2*c* are defined as a single second pixel unit PXU2, and one sensor driving unit SDU and two photoelectric conversion elements PD are defined as a single photo sensor unit PSU. In the subsidiary area SA, the second pixel driving units PDU2 and the photo sensors PS are arranged repeatedly in the first direction DR1 and the second direction DR2. For example, the second pixel driving units PDU2 of the first, second and third second pixel units PXU2 from the left are connected to the second subsidiary light-emitting elements SLE2 of the first, second and third second pixel units PXU2 from the left. The second pixel driving units PDU2 of the first, second and third second pixel units PXU2 from the right are connected to the first subsidiary light-emitting elements SLE1 of the first, second and third second pixel units PXU2 from the right.

The sensor driving units SDU of the first, second and third photo sensor units PSU from the left are connected to the second photoelectric conversion elements PD2 of the first, second and third photo sensor units PSU from the left. The sensor driving units SDU of the first, second and third photo sensor units PSU from the right are connected to the second photoelectric conversion elements PD2 of the first, second and third photo sensor units PSU from the right.

Hereinafter, other exemplary embodiments of the present disclosure will be described. The arrangement and connection relationships between the light-emitting elements LE and the first pixel driving units PDU1 disposed in the display area DA of a display device according to exemplary embodiments are substantially identical to those of FIGS. 9A and 9B; and, therefore, repeated descriptions will be omitted.

Hereinafter, a display device 1_2 according to an exemplary embodiment will be described with reference to FIGS. 13 to 17.

Figure 13:
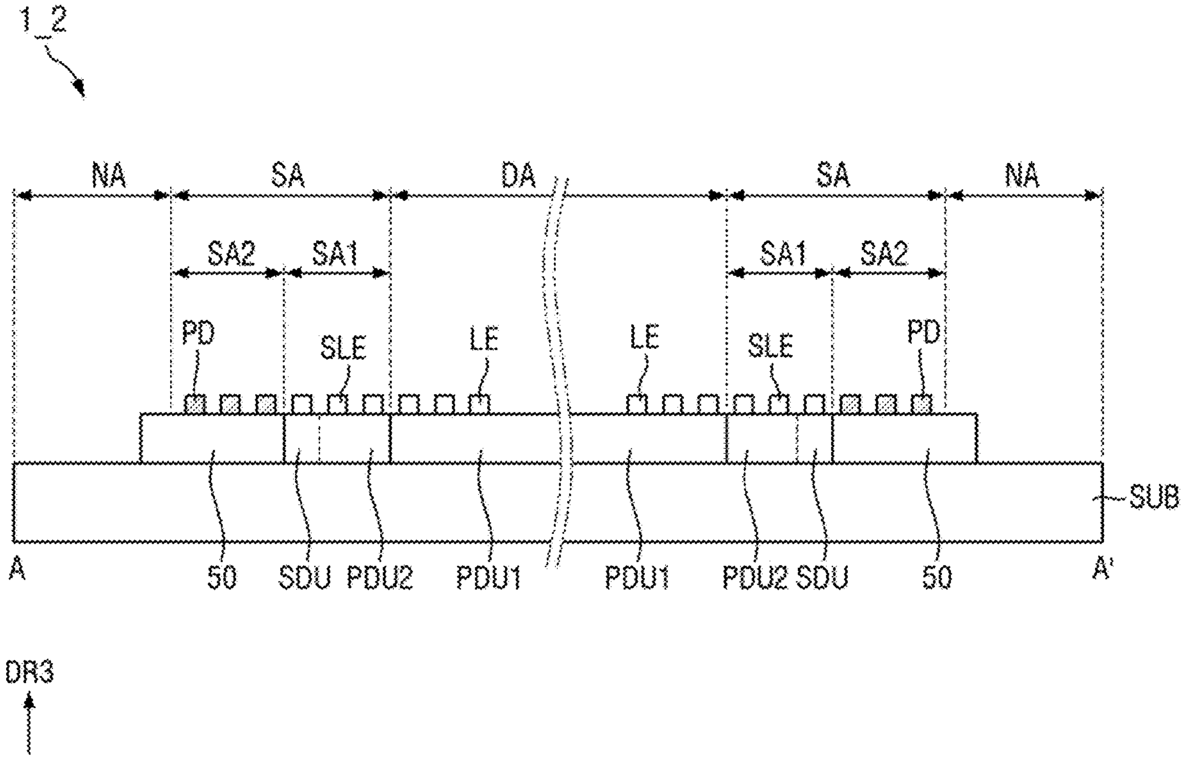
FIG. 13 is a cross-sectional view taken along line A-A' of FIG. 2 according to an exemplary embodiment of the present disclosure.

FIG. 13 is a cross-sectional view taken along line A-A' of FIG. 2 according to an exemplary embodiment of the present disclosure.

A display device 1_2 according to an exemplary embodiment differs from a display device according to an above-described exemplary embodiment in that photoelectric conversion elements PD are disposed in the second subsidiary area SA2 but not in the first subsidiary area SA1, and subsidiary light-emitting elements SLE are disposed in the first subsidiary area SA1 but not in the second subsidiary area SA2. For example, since the first subsidiary area SA1 includes only subsidiary light-emitting elements SLE, the first subsidiary area SA1 is substantially identical to the display area DA where images are displayed. Since the second subsidiary area SA2 includes only the photoelectric conversion elements PD, the second subsidiary area SA2 is substantially identical to the light-sensing area that senses outside light.

Second pixel driving units PDU2 and sensor driving units SDU are disposed in the first subsidiary area SA1, and a scan driver 50 is disposed in the second subsidiary area SA2, similar to an above-described exemplary embodiment.

For example, the subsidiary light-emitting elements SLE disposed in the first subsidiary area SA1 are connected to the second pixel driving units PDU2 and overlap the second pixel driving units PDU2. The photoelectric conversion elements PD disposed in the second subsidiary area SA2 are connected to the sensor driving units SDU, but do not overlap the sensor driving units SDU. The photoelectric conversion elements PD and the sensor driving units SDU are spaced apart from each other.

The second pixel driving units PDU2 are connected to the subsidiary light-emitting elements SLE and transmit a driving current to the subsidiary light-emitting elements SLE, and the sensor driving units SDU are connected to the photoelectric conversion elements PD and control their sensing current.

Figure 14:
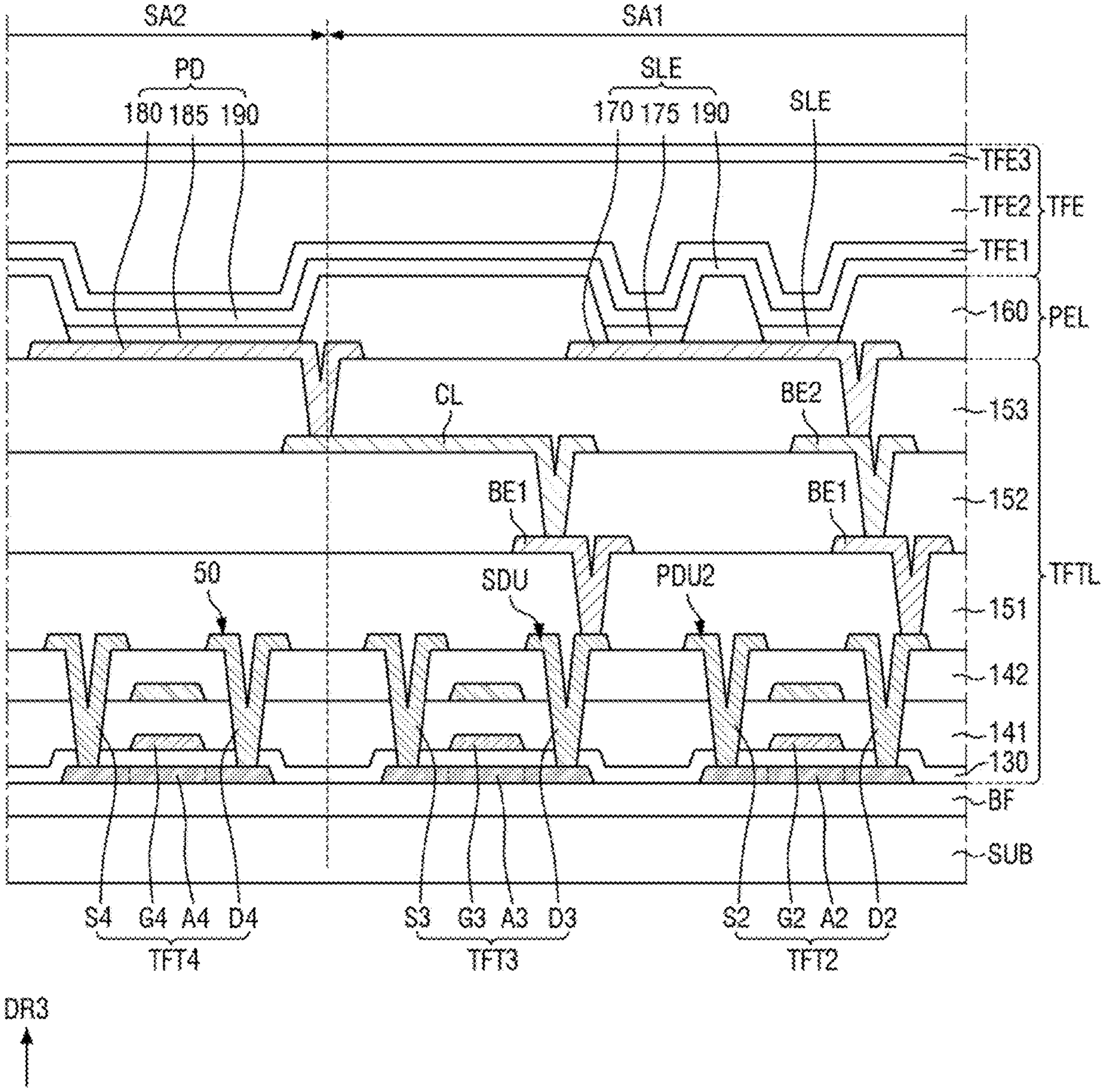
FIG. 14 is a cross-sectional view of a subsidiary area according to an exemplary embodiment of the present disclosure.

FIG. 14 is a cross-sectional view of a subsidiary area according to an exemplary embodiment of the present disclosure.

Referring to FIG. 14, in an embodiment, in the display device 1_2 according to an exemplary embodiment, one second pixel driving unit PDU2 is connected to two or more subsidiary light-emitting elements SLE, like in the above-described exemplary embodiment. However, an exemplary embodiment differs from an above-described exemplary embodiment in that one sensor driving unit SDU is connected to one photoelectric conversion element PD.

For example, each of the subsidiary light-emitting elements SLE includes a pixel electrode 170, an emissive layer 175, and a common electrode 190. Two subsidiary light-emitting elements SLE are connected to a second pixel driving unit PDU2 through a first bridge electrode BE1 and a second bridge electrode BE2. The light-emitting areas of the subsidiary light-emitting elements SLE overlap the second pixel driving unit PDU2 connected thereto, but embodiments of the present disclosure are not necessarily limited thereto. The plurality of subsidiary light-emitting elements SLE connected to the second pixel driving unit PDU2 emit light of the same color. For example, two first subsidiary light-emitting elements SLE1 connected to a second thin-film transistor TFT2 emit one of red, green or blue light.

In addition, one sensor driving unit SDU is connected to one photoelectric conversion element PD. The photoelectric conversion element PD is connected to the sensor driving unit SDU through a first bridge electrode BE1 and a connection line CL. The light-receiving area of the photoelectric conversion element PD does not overlap the sensor driving unit SDU connected thereto. The light-receiving area of the photoelectric conversion element PD overlaps a fourth thin-film transistor TFT4 of the scan driver 50.

According to an exemplary embodiment, the light-receiving area of one photoelectric conversion element PD connected to one sensor driving unit SDU is be larger than the light-emitting area of the two subsidiary light-emitting elements SLE connected to each other. Accordingly, light-receiving areas of the photoelectric conversion elements PD are obtained in the second subsidiary area SA2, so that a fingerprint sensing function can be achieved. For example, the area of the photoelectric conversion elements PD can be used interchangeably with the area of the light-receiving area.

Figure 15:
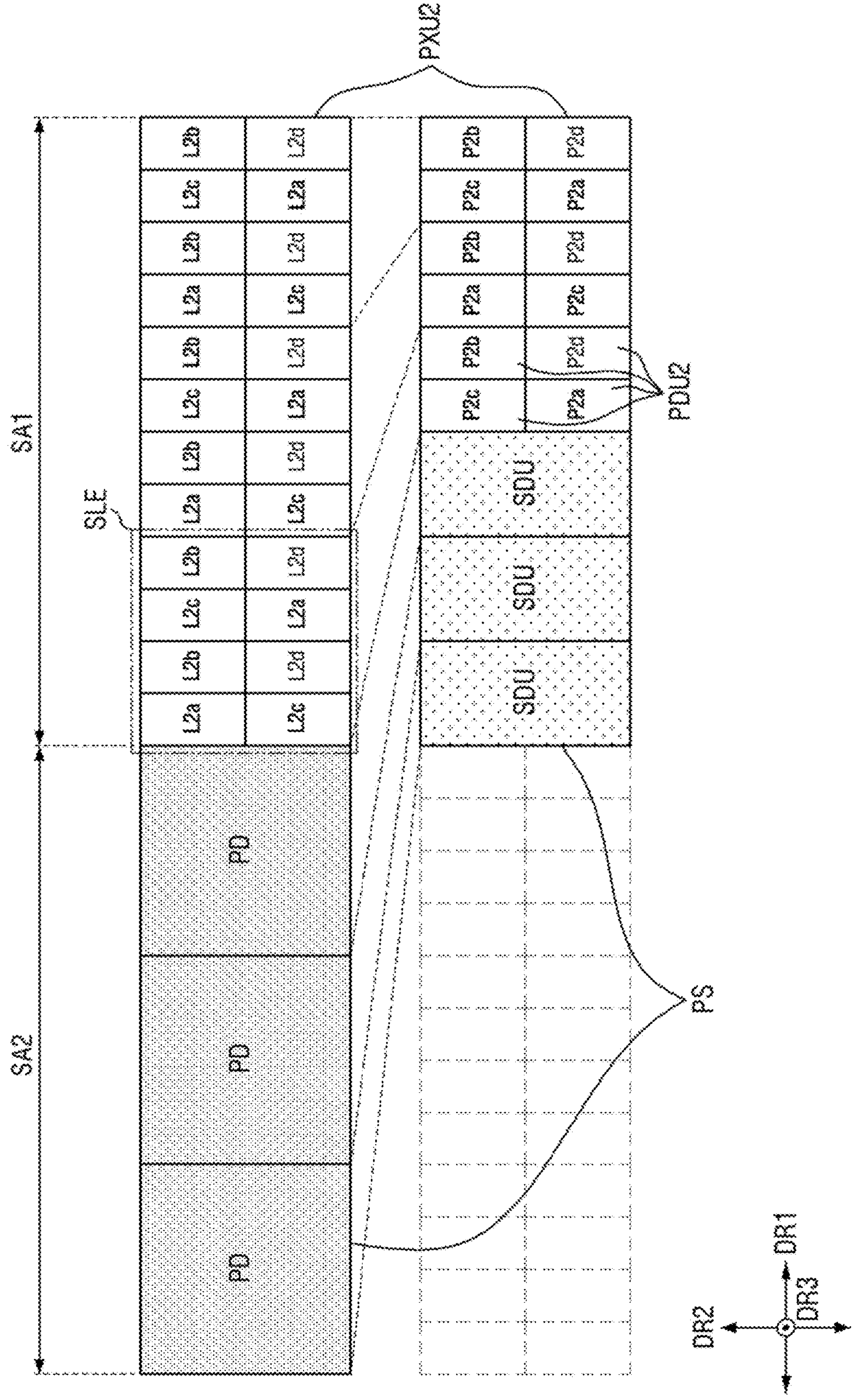
FIG. 15 is a plan view of arrangement relationships between second pixel driving units, second driving units, subsidiary light-emitting elements and photoelectric conversion elements of a display device according to another exemplary embodiment.
Figure 16:
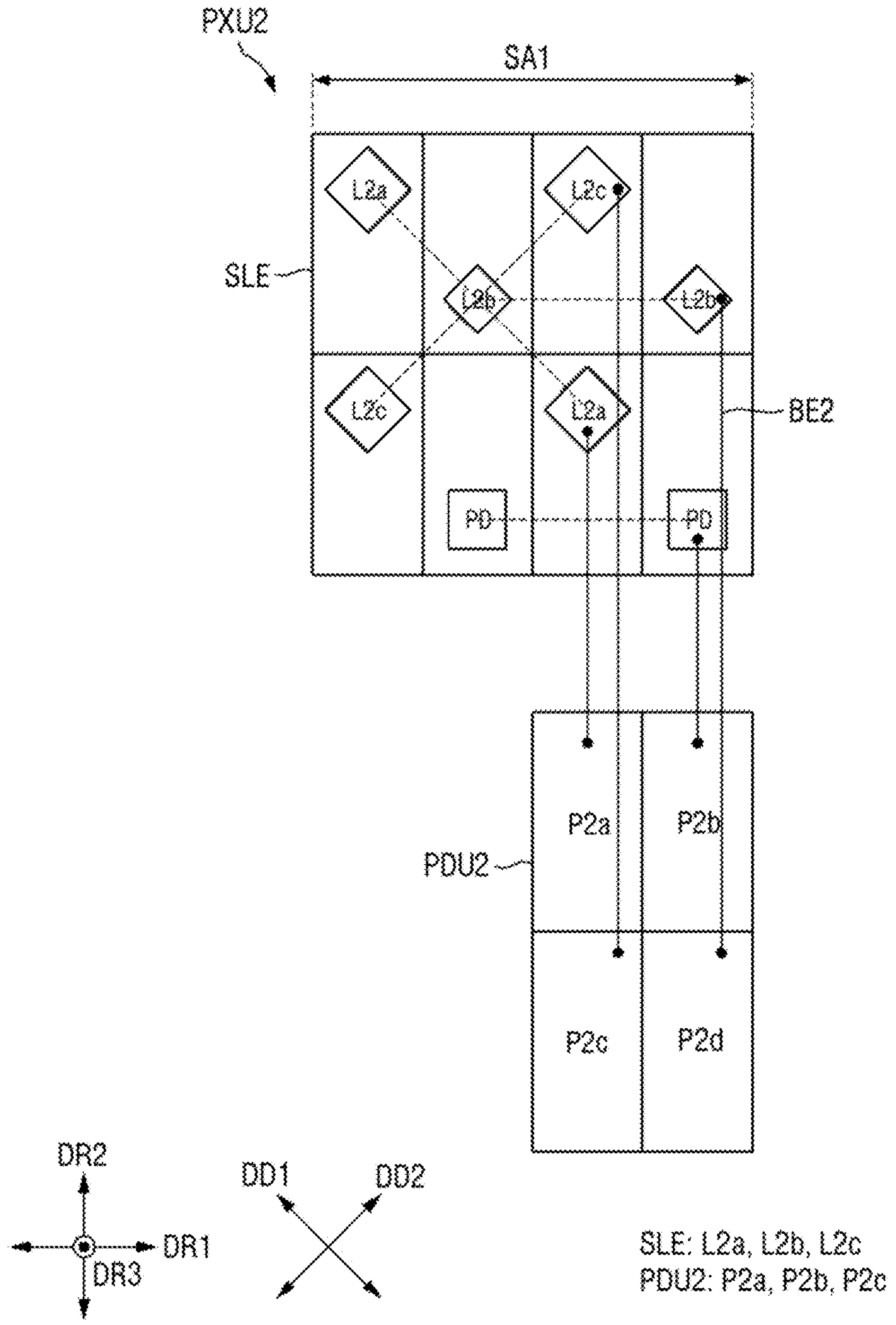
FIG. 16 is an enlarged plan view of arrangement relationships between the second pixel driving units and subsidiary light-emitting elements.
Figure 17:
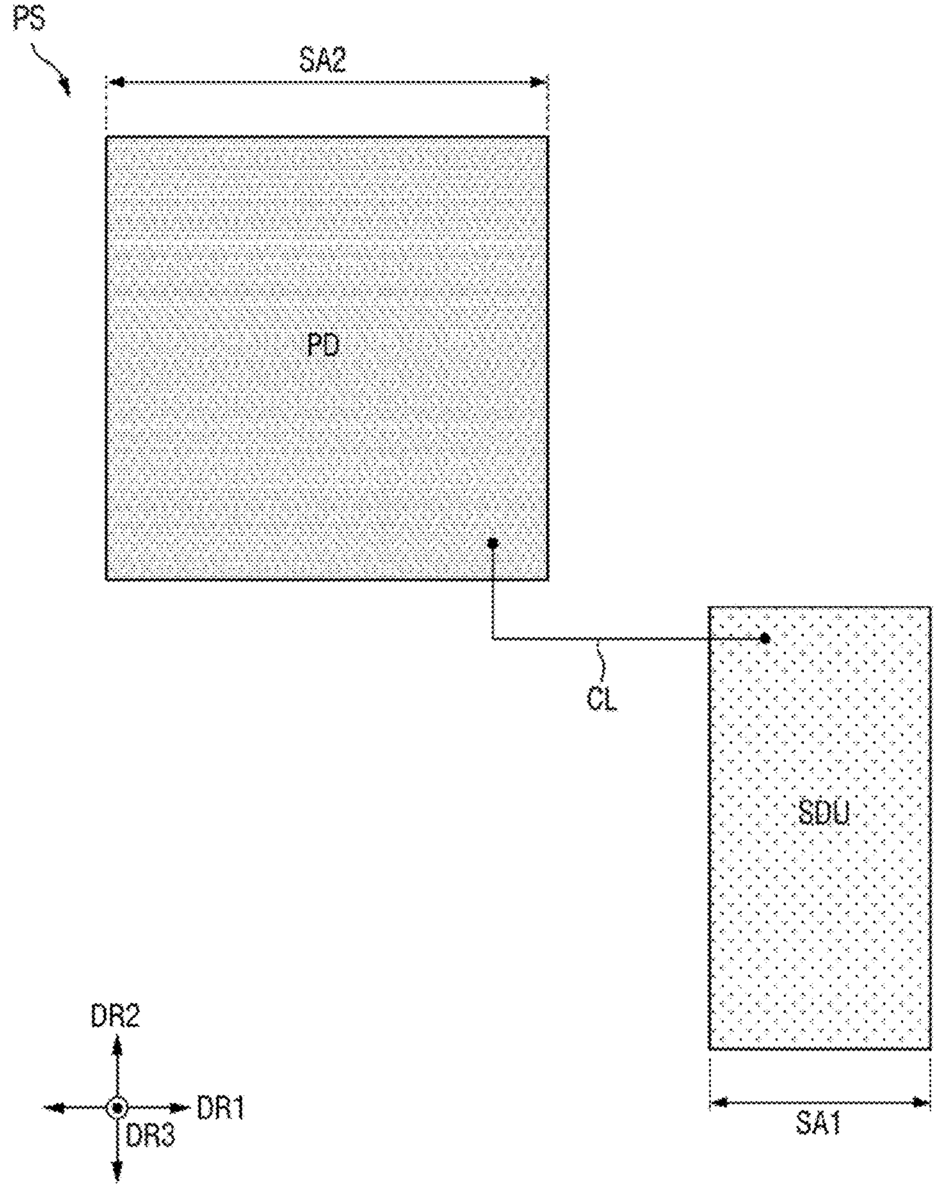
FIG. 17 is an enlarged plan view of arrangement relationships between the sensor driving units and the photoelectric conversion elements of FIG. 15.

FIG. 15 is a plan view of arrangement relationships between second pixel driving units, second driving units, subsidiary light-emitting elements and photoelectric conversion elements of a display device according to an exemplary embodiment. FIG. 16 is an enlarged plan view of arrangement relationships between the second pixel driving units and subsidiary light-emitting elements of FIG. 15. FIG. 17 is an enlarged plan view of arrangement relationships between the sensor driving units and the photoelectric conversion elements of FIG. 15.

Although the second pixel driving units PDU2 and the subsidiary light-emitting elements SLE are separately depicted in FIGS. 15 to 17, this is for convenience of illustration, and the subsidiary light-emitting elements SLE may overlap the second pixel driving units PDU2. Similarly, although the sensor driving units SDU and the photoelectric conversion elements PD are separately depicted in the drawings, the photoelectric conversion elements PD may overlap the sensor driving units SDU.

Referring to FIGS. 15 to 17, in an embodiment, each second pixel driving unit PDU2 is connected to two subsidiary light-emitting elements SLE, and one sensor driving unit SDU is connected to one photoelectric conversion element PD.

In the first subsidiary area SA1, the subsidiary light-emitting elements SLE include first color light-emitting elements L2*a*, second color light-emitting elements L2*b*, third color light-emitting elements L2*c*, and fourth color light-emitting elements L2*d*. Each of the first color light-emitting elements L2*a*, the second color light-emitting elements L2*b*, the third color light-emitting elements L2*c* and the fourth color light-emitting elements L2*d* emits light of a predetermined color. For example, the first color light-emitting elements L2*a* emit red light, the second color light-emitting elements L2*b* and the fourth color light-emitting element L2*d* emit green light, and the third color light-emitting elements L2*c* emit blue light. The photoelectric conversion elements PD generate a photocurrent by sensing the light emitted from the subsidiary light-emitting elements SLE.

The color light-emitting elements L1*a*, L1*b*, L1*c* and L1*d* are adjacent to one another in the first direction DR1 and the second direction DR2. For example, the first color light-emitting elements L1*a* and the second color light-emitting elements L1*b* are adjacent to each other in the first direction DR1, and the third color light-emitting elements L1*c* and the fourth color light-emitting elements L1*d* are adjacent to each other in the first direction DR1. The first color light-emitting elements L1*a* and the third color light-emitting elements L1*c* are adjacent to each other in the second direction DR2, and the second color light-emitting elements L1*b* and the fourth color light-emitting elements L1*d* are adjacent to each other in the second direction DR2.

The light-emitting areas of the color light-emitting elements L1*a*, L1*b*, L1*c* and L1*d* are adjacent to each other in the diagonal directions DD1 and DD2. For example, the first color light-emitting elements L2*a* and the second color light-emitting elements L2*b* are adjacent to each other in the first diagonal direction DD1. The third color light-emitting elements L2*c* and the fourth color light-emitting elements L2*d* are adjacent to each other in the first diagonal direction DD1.

The second pixel driving units PDU2 include first color pixel driving units P2*a*, second color pixel drive units P2*b*, third color pixel driving units P2*c*, and fourth pixel driving units P2*d*. Each of the first color pixel driving units P2*a* is connected to two first color light-emitting elements L2*a*. Each of the second color pixel driving units P2*b* is connected to two second color light-emitting elements L2*b*. Each of the third color pixel driving units P2*c* is connected to two third color light-emitting elements L2*c*. Each of the fourth color pixel driving units P2*d* is connected to two fourth color light-emitting elements L2*d*.

The subsidiary light-emitting element SLE disposed in the first subsidiary area SA1 are connected to the second pixel driving units PDU2 through second bridge electrodes BE2. Some of the subsidiary light-emitting elements SLE overlap the second pixel driving units PDU2 connected thereto, while other subsidiary light-emitting elements SLE overlap the second pixel driving units PDU2 not connected thereto.

The first color pixel driving unit P2*a* and the second color pixel driving unit P2*b* are adjacent to each other in the first direction DR1, and the third color pixel driving unit P2*c* and the fourth color pixel driving unit P2*d* are adjacent to each other in the first direction DR1. The first color pixel driving unit P2*a* and the third color pixel driving unit P2*c* are adjacent to each other in the second direction DR2, and the second color pixel driving unit P2*b* and the fourth color pixel driving unit P2*d* are adjacent to each other in the second direction DR2.

Two of the color light-emitting elements L2*a*, L2*b*, L2*c* and L2*d* are connected to one of the color pixel driving units P2*a*, P2*b*, P2*c* and P2*d*. Two of the color light-emitting elements L2*a*, L2*b*, L2*c* and L2*d* are connected through the extended pixel electrode 170 of the photoelectric element layer PEL.

In the second subsidiary area SA2, the photoelectric conversion elements PD are repeatedly arranged in the first direction DR1 and the second direction DR2. The photoelectric conversion elements PD are connected to the sensor driving units SDU. The photoelectric conversion elements PD are connected to the sensor driving units SDU through the connection lines CL. The photoelectric conversion elements PD are connected to the sensor driving units SDU connected thereto.

Four color pixel driving units P2*a*, P2*b*, P2*c* and P2*d* and eight color light-emitting elements L2*a*, L2*b*, L2*c* and L2*d* are defined as a single second pixel unit PXU2, and one sensor driving unit SDU and one photoelectric conversion element PD are defined as a single photo sensor PS.

For example, the second pixel driving units PDU2 of the third second pixel units PXU2 from the right are connected to the subsidiary light-emitting elements SLE of the third second pixel units PXU2 from the right. The subsidiary light-emitting elements SLE of the third second pixel units PXU2 from the right overlap the sensor driver SDU in the first auxiliary area SA1.

The area of one sensor driving unit SDU differs from the area of one pixel driving unit PDU1 and PDU2. For example, the area of the sensor driving units SDU is greater than the area of the second pixel driving units PDU2. The area of the sensor driving units SDU is four times the area of the second pixel driving units PDU2. For example, the area of the sensor driving units SDU is equal to the area of the second pixel driving units PDU2 of the second pixel unit PXU2.

The area of one photoelectric conversion element PD differs from the area of one subsidiary light-emitting element SLE, or the light-emitting element LE. For example, the area of the photoelectric conversion elements PD is greater than the area of the subsidiary light-emitting elements SLE. The area of the photoelectric conversion elements PD is eight times the area of the subsidiary light-emitting elements SLE. For example, the area of the photoelectric conversion elements PD is equal to the area of the subsidiary light-emitting elements SLE of the second pixel unit PXU2.

Hereinafter, a display device 1 . . . 3 according to an exemplary embodiment will be described with reference to FIGS. 18 to 21.

Figure 18:
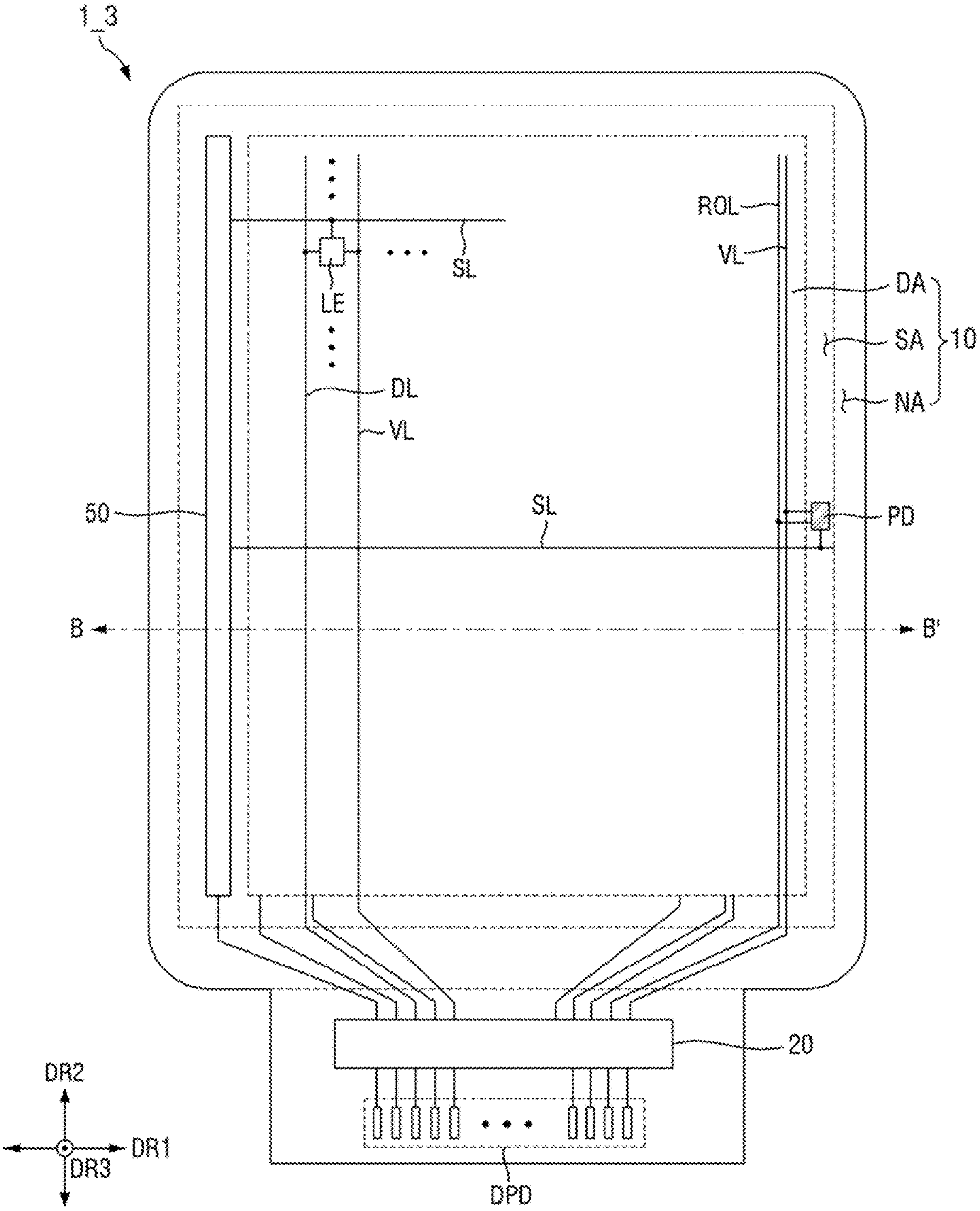
FIG. 18 is a plan view of a display panel according to an exemplary embodiment of the present disclosure.
Figure 19:
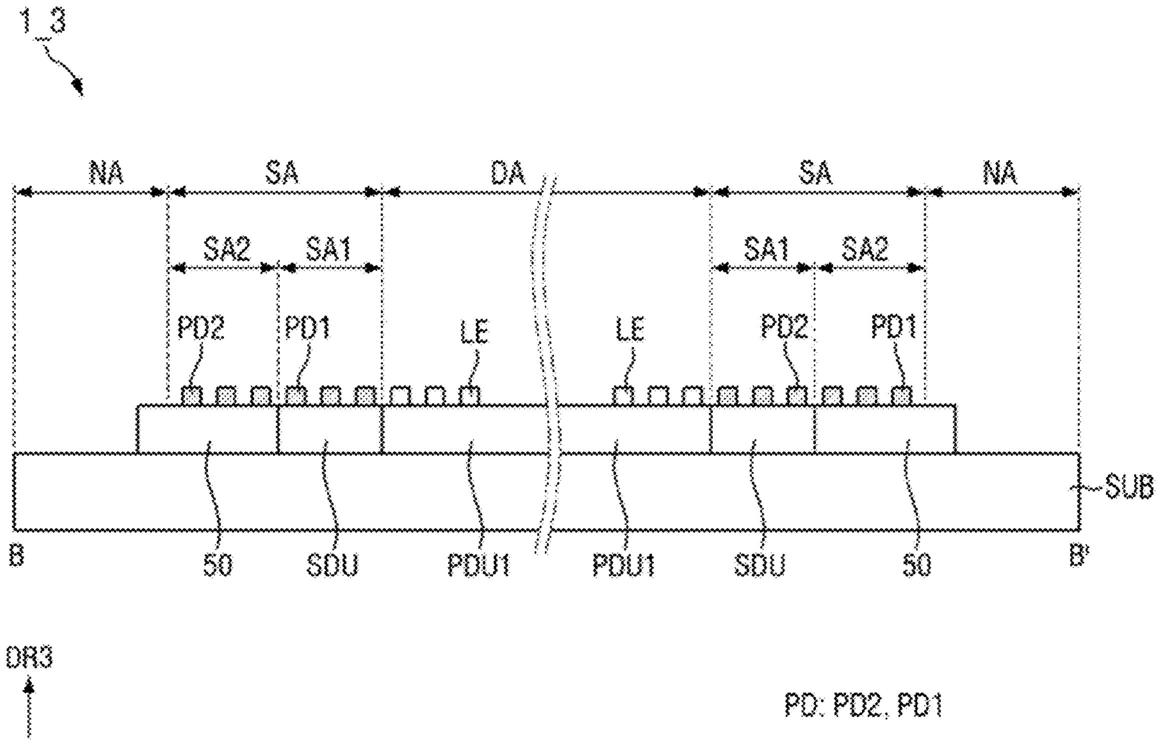
FIG. 19 is a cross-sectional view taken along line B-B' of FIG. 18 according to an exemplary embodiment of the present disclosure.
Figure 20:
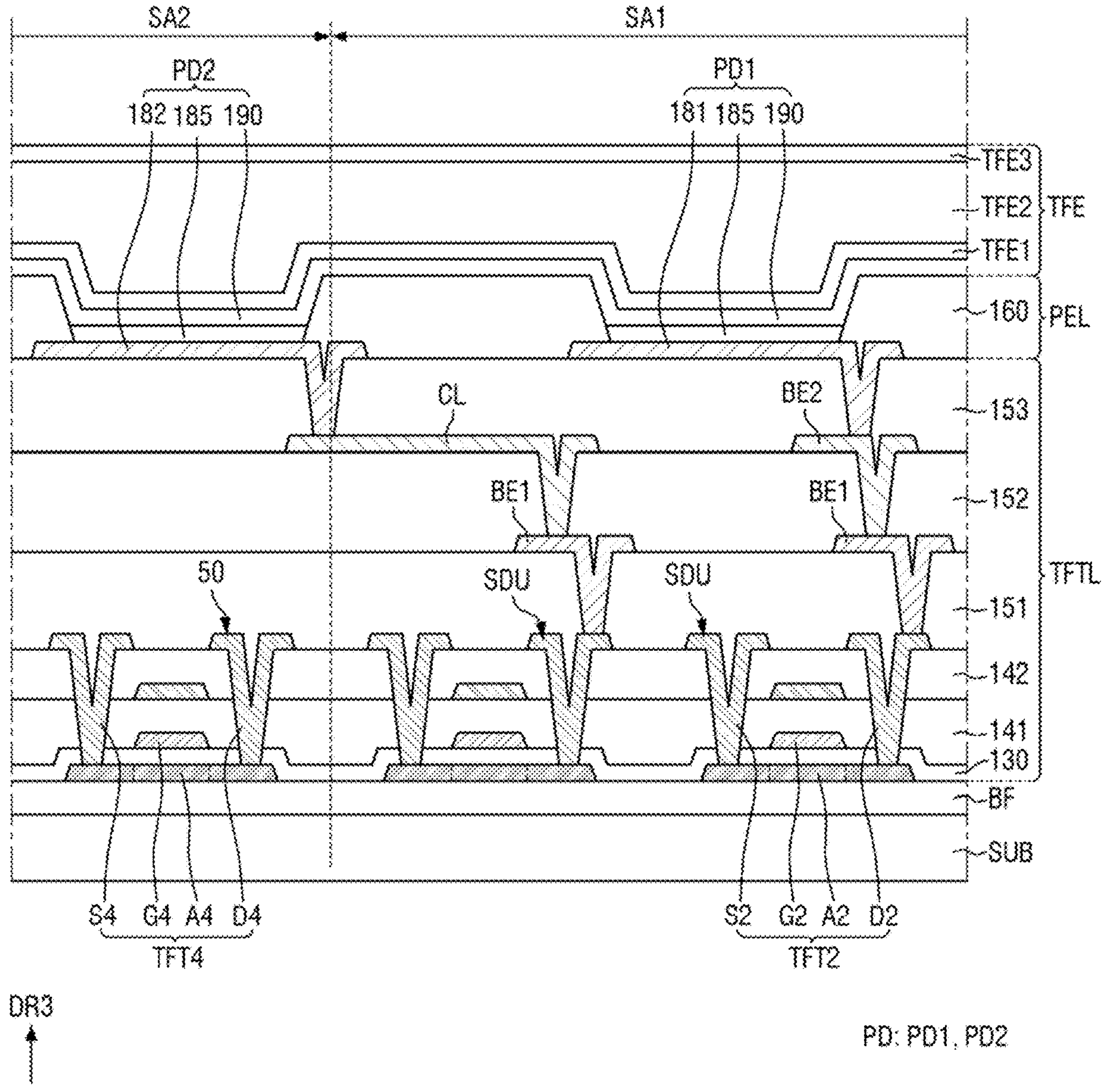
FIG. 20 is a cross-sectional view of a subsidiary area of FIG. 19.
Figure 21:
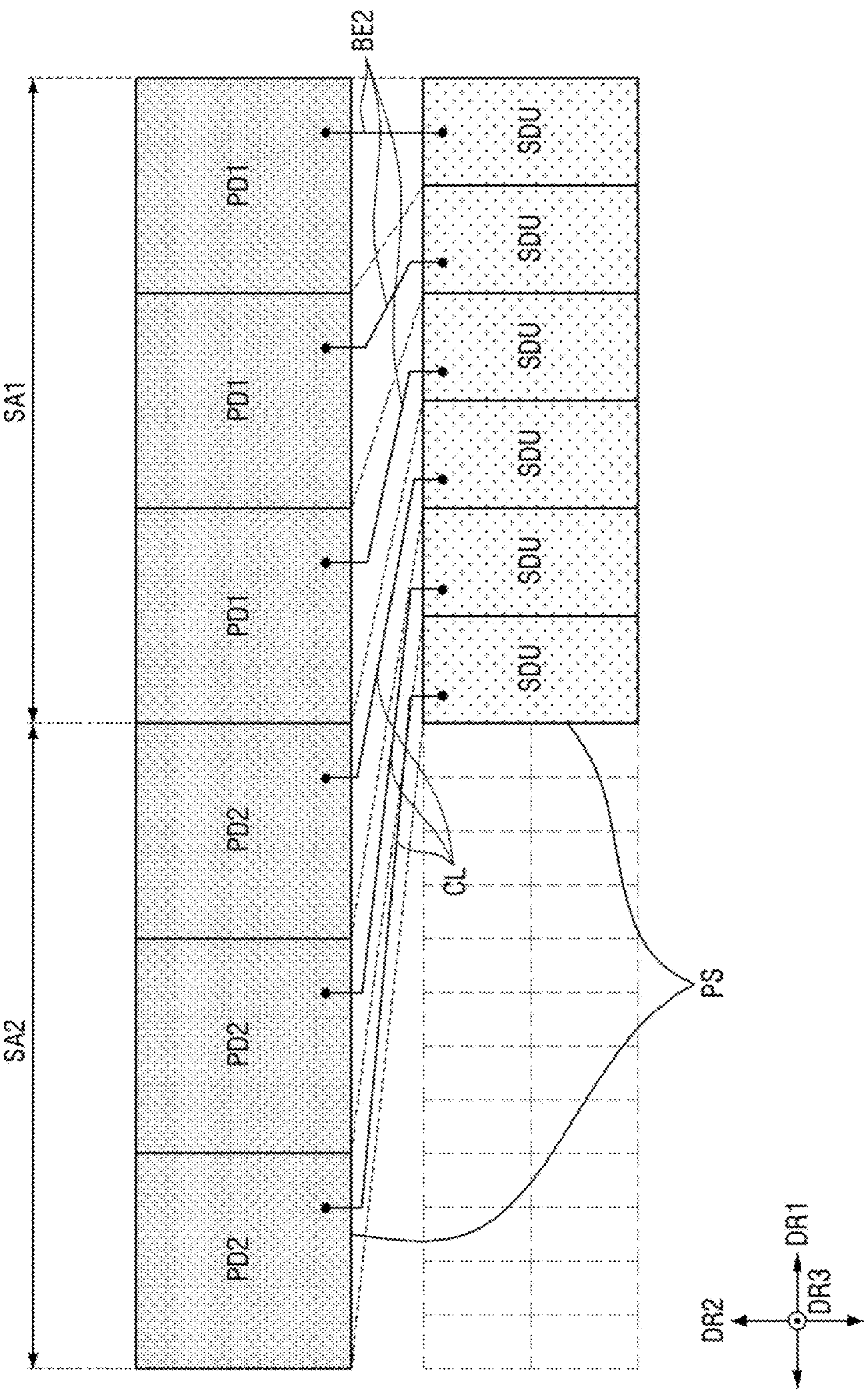
FIG. 21 is a plan view of arrangement relationships between the sensor driving units and the photoelectric conversion elements of FIG. 19.

FIG. 18 is a plan view of a display panel according to an exemplary embodiment of the present disclosure. FIG. 19 is a cross-sectional view taken along line B-B' of FIG. 18. FIG. 20 is a cross-sectional view of a subsidiary area of FIG. 19. FIG. 21 is a plan view of arrangement relationships between the sensor driving units and the photoelectric conversion elements of FIG. 19.

An exemplary embodiment differs from an above-described exemplary embodiment in that a display device 1_3 lacks a subsidiary light-emitting element and a second pixel driving unit disposed in the subsidiary area SA. Specifically, photoelectric conversion elements PD and sensor driving units SDU are disposed in the subsidiary area SA. For example, since the subsidiary area SA includes only the photoelectric conversion elements PD, the subsidiary area SA is substantially identical to a light-sensing area that senses external light.

According to an exemplary embodiment, the photoelectric conversion elements PD are disposed in the subsidiary area SA. First photoelectric conversion elements PD1 are disposed in a first subsidiary area SA1 and are connected to the sensor driving units SDU, and may or may not overlap the sensor driving units SDU. For example, some of the first photoelectric conversion elements PD1 are spaced apart from the sensor driving units SDU. In an embodiment shown in FIGS. 20 and 21, the first photoelectric conversion element PD1 is connected to the sensor driving unit SDU through a first bridge electrode BE1 and a second bridge electrode BE2.

Second photoelectric conversion elements PD2 are disposed in a second subsidiary area SA2 and are connected to the sensor driving units SDU, and do not overlap the sensor driving units SDU. For example, the second photoelectric conversion elements PD2 are spaced apart from the sensor driving units SDU. The second photoelectric conversion elements PD2 overlap the scan driver 50. In an embodiment shown in FIGS. 20 and 21, the second photoelectric conversion elements PD2 are connected to the sensor driving units SDU through first bridge electrodes BE1 and connection lines CL. The connection lines CL are disposed across the first subsidiary area SA1 and the second subsidiary area SA2.

Referring to FIG. 21, in an embodiment, one sensor driving unit SDU and one photoelectric conversion element PD are defined as a single photo sensor PS. The sensor driving unit SDU of the first photo sensors PS from the right is connected to the first photoelectric conversion element PD1 of the first photo sensors PS from the right, and they overlap each other. The sensor driving unit SDU of the third photo sensors PS from the right is connected to the first photoelectric conversion element PD1 of the third photo sensors PS from the right, but they do not overlap each other. For example, the first photoelectric conversion element PD1 of the third photo sensor PS from the right overlaps the sensor driving unit SDU connected to the second photoelectric conversion elements PD2 of the fifth and sixth photo sensors PS from the right. The sensor driving unit SDU of the first photo sensors PS from the left is connected to the second photoelectric conversion element PD2 of the first photo sensors PS from the left, but they do not overlap each other.

The area of one photoelectric conversion element PD is greater than the area of one light-emitting element LE disposed in the display area DA in FIG. 9A. For example, the area of one photoelectric conversion element PD is equal to the area of eight light-emitting elements LE. In addition, the area of one sensor driving unit SDU is greater than the area of one first pixel driving unit PDU1. For example, the area of one sensor driving unit SDU is equal to the area of four first pixel driving units PDU1. The display device 1_3 according to an exemplary embodiment provides light-receiving areas for the photoelectric conversion elements PD in the second subsidiary area SA2, so that a fingerprint sensing function can be achieved.

Hereinafter, a display device 1_4 according to an exemplary embodiment will be described with reference to FIGS. 22 and 23.

Figure 22:
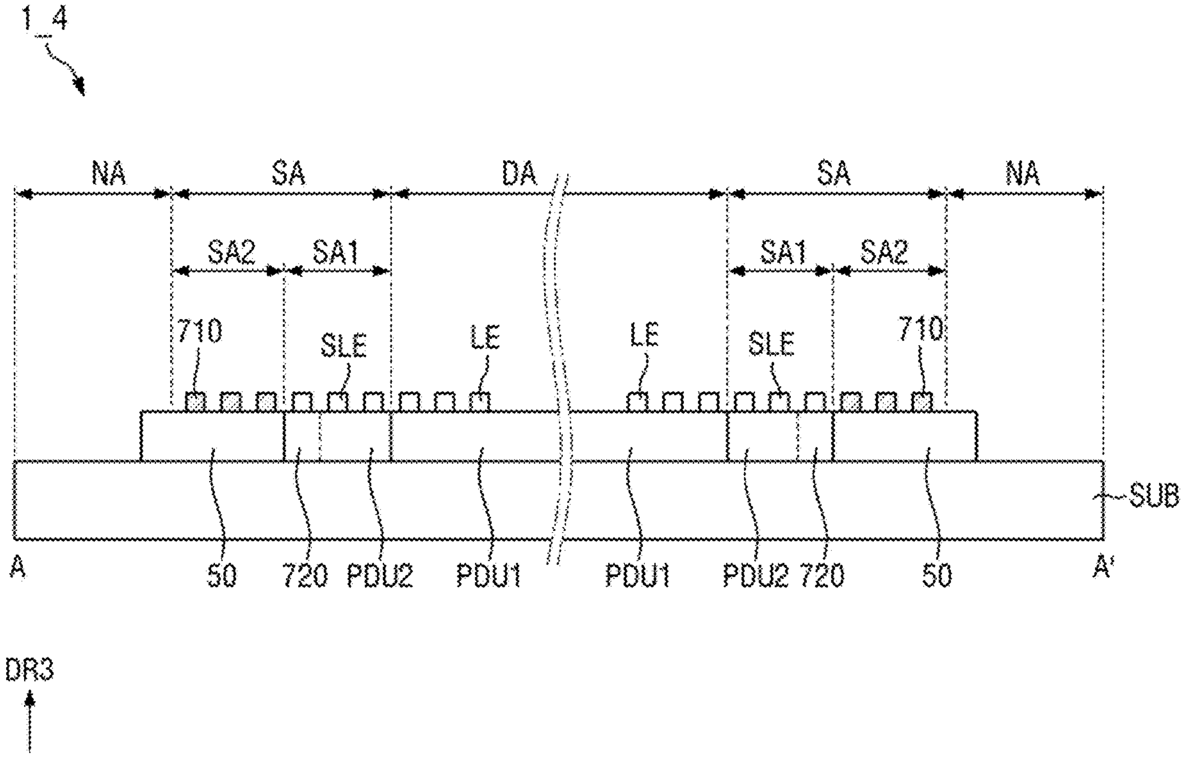
FIG. 22 is a cross-sectional view taken along line A-A' of FIG. 2 according to an exemplary embodiment of the present disclosure.

FIG. 22 is a cross-sectional view taken along line A-A' of FIG. 2 according to an exemplary embodiment of the present disclosure. FIG. 23 is a plan view of arrangement relationships between second pixel driving units, optical driving units, subsidiary light-emitting elements and optical elements of a display device according to an exemplary embodiment.

According to an exemplary embodiment, a display device 1_4 includes a variety of optical devices, such as an image sensor that captures an image from the front side, a proximity sensor that detects whether a user is located close to the front side of the display device, or an illuminance sensor that senses the luminance on the front side of the display device. In addition, the display device 1_4 may include an IR light source that emits light in an infrared wavelength band and an IR driver.

The optical devices may include optical elements 710 and optical driving units 720 that drive the optical elements 710. Light-emitting elements LE and first pixel driving units PDU1 are disposed in the display area DA. The light-emitting elements LE are connected to the first pixel driving units PDU1, respectively, and overlap each other.

In the first subsidiary area SA1, subsidiary light-emitting elements SLE and second pixel driving units PDU2 that drive the subsidiary light-emitting elements SLE, optical driving units 720 that drive the optical elements 710, are disposed. The subsidiary light-emitting elements SLE are connected to the second pixel driving units PDU2, respectively. The subsidiary light-emitting elements SLE may or may not overlap the second pixel driving units PDU2.

In the second subsidiary area SA2, the optical elements 710 and the scan driver 50 are disposed. The optical elements 710 are connected to the optical driving units 720. The optical elements 710 do not overlap the optical driving units 720. The optical elements 710 in the second subsidiary area SA2 overlap the scan driver 50.

A display device according to an exemplary embodiment is similar to the display device 1_2 according to an exemplary embodiment of FIGS. 13 to 17 in that subsidiary light-emitting elements SLE are disposed in the first subsidiary area SA1 but not in the second subsidiary area SA2. The optical elements 710 are disposed in the second subsidiary area SA2 but not in the first subsidiary area SA1.

For example, since the first subsidiary area SA includes only subsidiary light-emitting elements SLE, the first subsidiary area SA1 is substantially identical to the display area where images are displayed. Since the second subsidiary area SA2 includes only the optical elements 710, the second subsidiary area SA2 is substantially identical to an optical area that senses light.

For example, when the optical devices are proximity sensors that sense whether a user is positioned close to the front surface of a display device, the optical elements 710 sense the light incident on the front surface of the display device 1_4 through the second subsidiary area SA2. A main processor connected to the display device 1_4 determines whether an object is located close to the front surface of the display device 1_4 based on a proximity sensor signal received from the proximity sensors.

For example, when the optical devices are illuminance sensors that sense illuminance on the front surface of a display device, the optical elements 710 sense the light incident on the front surface of the display device 1_4 through the second subsidiary area SA2. The main processor connected to the display device 1_4 determines the luminance on the front surface of the display device 1_4 based on an illuminance sensor signal received from the illuminance sensors.

For example, when the optical devices include an IR light source that emits light in an infrared wavelength band and an IR driver, the optical elements 710 emits light in the infrared wavelength band through the second subsidiary area SA2.

Figure 23:
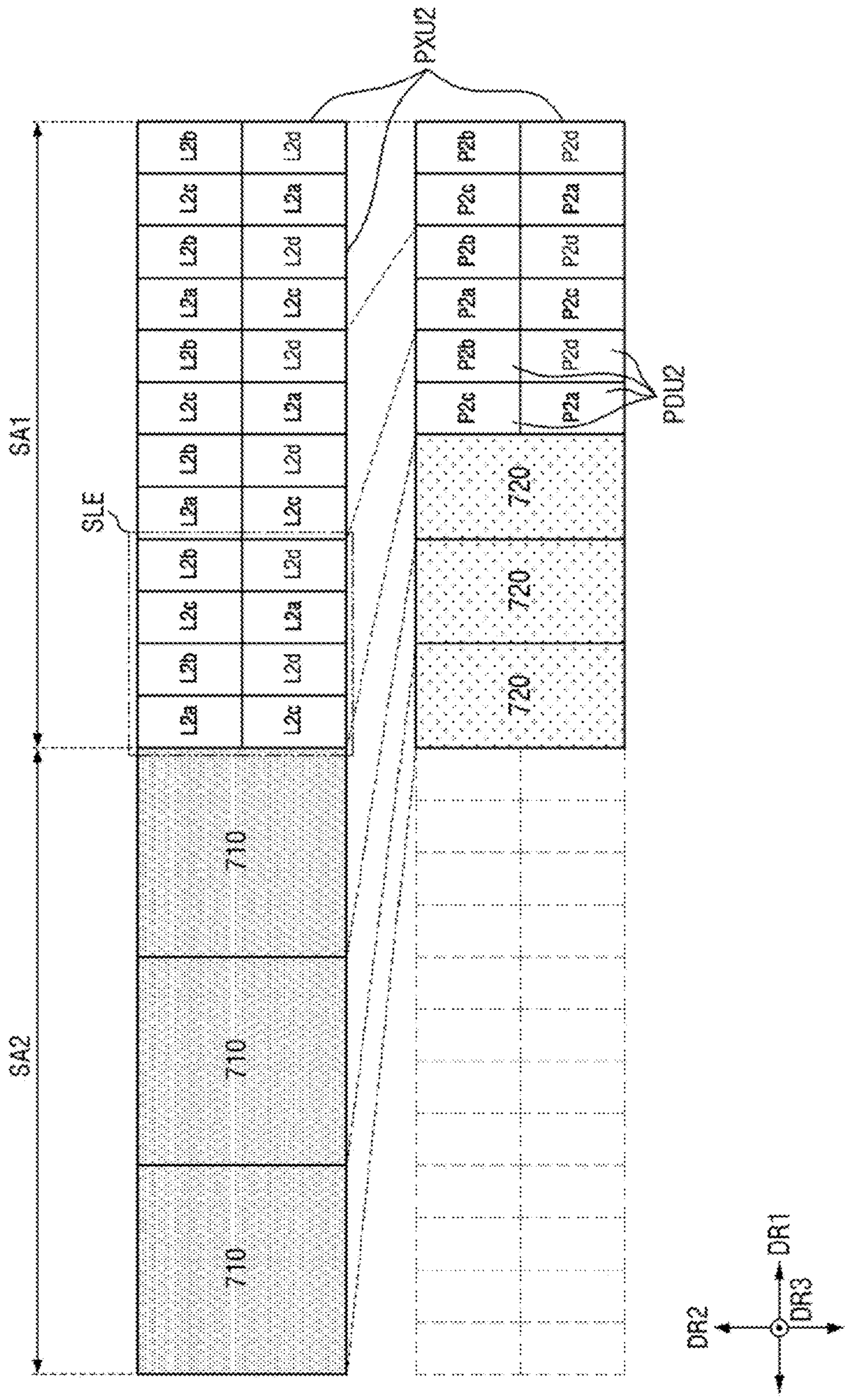
FIG. 23 is a plan view of arrangement relationships between second pixel driving units, IR emission driving units, subsidiary light-emitting elements and IR light-emitting elements of a display device of FIG. 22.

Referring to FIG. 23, in an embodiment, one second pixel driving unit PDU2 is connected to two or more subsidiary light-emitting elements SLE. One optical driving units 720 is connected to one optical element 710. Four second pixel driving units PDU2 and eight subsidiary light-emitting elements SLE form one second pixel unit PXU2. The arrangement structure of the first subsidiary area SA1 is identical to that of FIGS. 15 to 17; and, therefore, a repeated description will be omitted.

In the second subsidiary area SA2, the optical elements 710 are repeatedly arranged in the first direction DR1 and the second direction DR2. The optical elements 710 are connected to the optical driving units 720. The optical elements 710 are connected to the optical driving units 720 through connection lines that extend across the first subsidiary area SA1 and the second subsidiary area SA2. The optical elements 710 do not overlap the optical driving units 720 connected thereto.

The area of one optical driving unit 720 differs from the area of one pixel driving unit PDU1 and PDU2. For example, the area of the optical driving units 720 is greater than the area of the second pixel driving units PDU2. The area of the optical driving units 720 is four times the area of the second pixel driving units PDU2. For example, the area of the optical driving units 720 is equal to the area of the second pixel driving units PDU2 of the second pixel unit PXU2.

The area of one optical element 710 differs from the area of one subsidiary light-emitting element SLE, or the light-emitting element LE. For example, the area of the optical element 710 is greater than the area of the subsidiary light-emitting elements SLE. The area of the optical element 710 is eight times the area of the color light-emitting elements. For example, the area of the optical elements 710 is equal to the area of the subsidiary light-emitting elements SLE of the second pixel unit PXU2.

Hereinafter, a display device 1_5 according to an exemplary embodiment will be described with reference to FIGS. 24 and 25.

Figure 24:
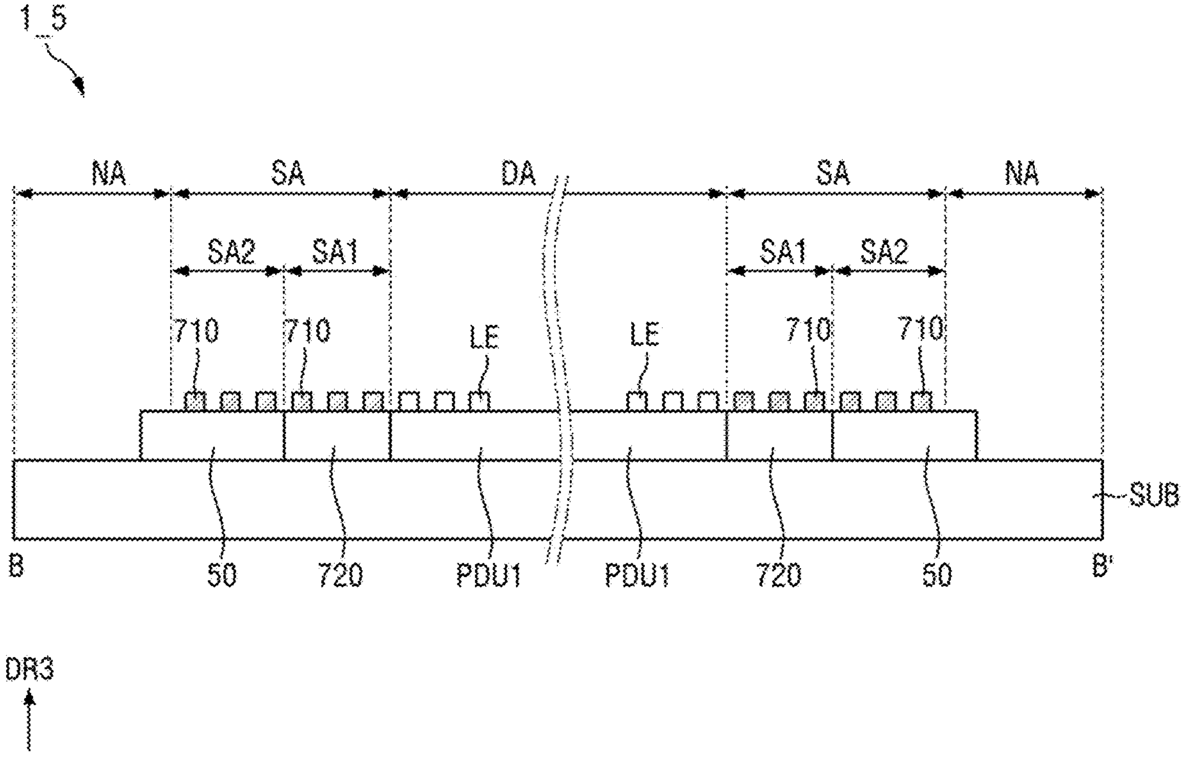
FIG. 24 is a cross-sectional view taken along line B-B' of FIG. 18 according to an exemplary embodiment of the present disclosure.

FIG. 24 is a cross-sectional view taken along line B-B' of FIG. 18 according to an exemplary embodiment of the present disclosure. FIG. 25 is a plan view of an arrangement relationship of IR emission drivers and IR light-emitting elements of a display device of FIG. 24.

A display device 1_5 according to an exemplary embodiment includes optical devices. The optical devices include optical elements 710 and optical drivers 720 that drive the optical elements 710.

The display device 1_5 according to an exemplary embodiment is similar to the display device 1_3 of FIGS. 18 to 21 in that the former include no subsidiary light-emitting element disposed in the subsidiary area SA. For example, the optical elements 710 and the optical driving units 720 are disposed in the subsidiary area SA. For example, since the subsidiary area SA includes only the optical elements 710, the subsidiary area SA is substantially identical to an optical area for sensing light.

In the first subsidiary area SA1, optical elements 710 and optical driving units 720 that drive the optical elements are disposed. The optical elements are connected to the optical driving units 720, respectively. The optical elements 710 overlap the optical driving units 720.

In the second subsidiary area SA2, the optical elements 710 and the scan driver 50 are disposed. The optical elements 710 are connected to the optical driving units 720. The optical elements 710 do not overlap the optical driving units 720. The optical elements 710 in the second subsidiary area SA2 overlap the scan driver 50.

The display device according to this exemplary embodiment differs from the display device 1_4 according to the exemplary embodiment of FIGS. 22 to 23 in that optical elements 710 are disposed in both the first subsidiary area SA1 and the second subsidiary area SA2.

In this instance, since the subsidiary area SA includes only optical elements 710, the first subsidiary area SA1 and the subsidiary area SA2 are substantially identical to an optical area that senses light.

Figure 25:
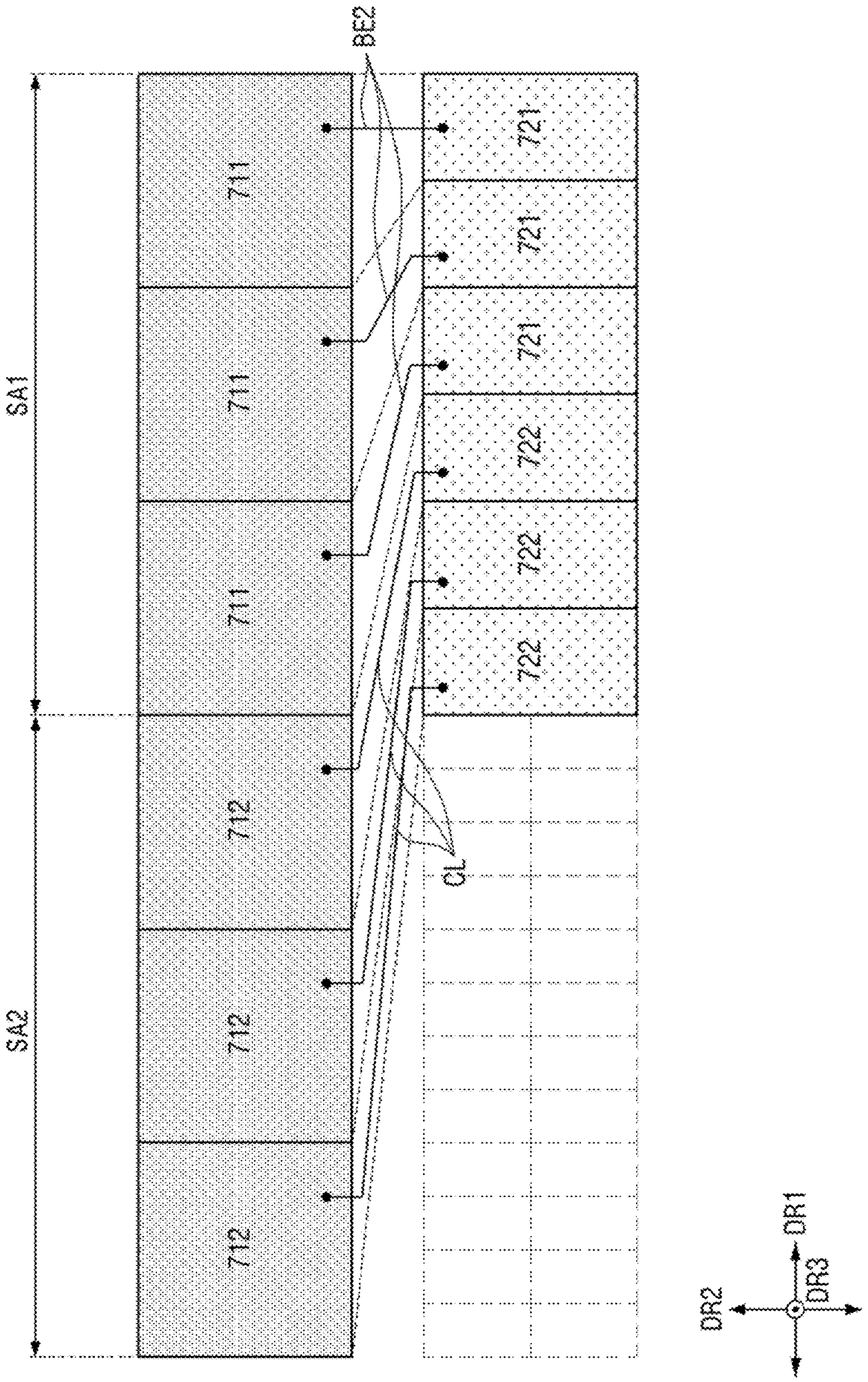
FIG. 25 is a plan view of an arrangement relationship of IR emission drivers and IR light-emitting elements of a display device of FIG. 24.

Referring to FIG. 25, the optical drivers 720 are connected to the optical elements 710, respectively. The optical elements 710 include first optical elements 711 and second optical elements 712, and the optical drivers 720 include first optical drivers 721 and second optical driving units 72. The first optical elements 711 are disposed in the first subsidiary area SA1 and are connected to the first optical drivers 721, respectively. The first optical elements 711 may or may not overlap with the first optical drivers 721. For example, the first of the first optical elements 711 from the right overlaps the first of the first optical driving units 721 from the right, but the third first optical elements 711 from the right does not overlap the third first optical driving units 721 from the right.

The second optical elements 712 disposed in the second subsidiary area SA2 are connected to second optical driving units 721, respectively. The second optical elements 712 do not overlap the second optical driving units 722.

The area of one optical element 710 is greater than the area of one light-emitting element LE disposed in the display area DA in FIG. 9A. For example, the area of one optical element 710 is equal to the area of eight light-emitting elements LE. In addition, the area of one optical driver 720 is greater than the area of one first pixel driving unit PDU1. For example, the area of one optical driver 720 is equal to the area of four first pixel driving units PDU1. The display device 1_5 according to an exemplary embodiment can perform various functions by providing an optical area for the optical elements 710 disposed in the subsidiary area SA. The optical elements 710 may include an image sensor that captures an image from the front side, a proximity sensor that detects whether a user is located close to the front side of the display device, an illuminance sensor that senses the illuminance on the front side of the display device, or an IR light source that emits light in an infrared wavelength band.

In concluding the detailed description, those skilled in the art will appreciate that many variations and modifications can be made to embodiments without substantially departing from the principles of embodiments of the disclosure. Therefore, embodiments of the disclosure are used in a generic and descriptive sense only and not for purposes of limitation.

What is claimed is:

1. An electronic device, comprising:
a display device, wherein the display device comprises:
a substrate that includes a display area and a subsidiary area adjacent to the display area in a plan view;
a first pixel driving unit disposed in the display area;
a light-emitting element disposed in the display area and connected to the first pixel driving unit;
a plurality of sensor driving units disposed in the subsidiary area; and
a plurality of photoelectric conversion elements disposed in the subsidiary area and connected to the plurality of sensor driving units, respectively,
wherein one sensor driving unit of the plurality of sensor driving units and one photoelectric conversion element of the plurality of photoelectric conversion elements are spaced apart from each other when viewed in a plan view.

2. An electronic device, comprising:
a display device, wherein the display device comprises:
a substrate that includes a display area and a subsidiary area adjacent to the display area in a plan view;
a first pixel driving unit disposed in the display area;
a light-emitting element disposed in the display area and connected to the first pixel driving unit;
a plurality of sensor driving units disposed in the subsidiary area; and a plurality of photoelectric conversion elements disposed in the subsidiary area and connected to the plurality of sensor driving units, respectively, wherein the subsidiary area comprises a first subsidiary area and a second subsidiary area, wherein the first subsidiary area is disposed between the display area and the second subsidiary area, wherein the plurality of sensor driving units are disposed in the first subsidiary area, and wherein at least one photoelectric conversion element of the plurality of photoelectric conversion elements is disposed in the second subsidiary area.

3. The electronic device of claim 2, further comprising:

connection lines that connect the plurality of sensor driving units with the plurality of photoelectric conversion elements, respectively, wherein the connection lines are disposed across the first subsidiary area and the second subsidiary area.

4. The electronic device of claim 1, further comprising:

a plurality of second pixel driving units disposed in the subsidiary area; and a plurality of subsidiary light-emitting elements connected to one of the plurality of second pixel driving units.

5. The electronic device of claim 4, wherein the subsidiary light-emitting elements are adjacent to each other in one direction and are connected through a pixel electrode.

6. The electronic device of claim 4, wherein each of the plurality of subsidiary light-emitting elements emit a same light.

7. The electronic device of claim 4, wherein a first subsidiary light-emitting element of the plurality of subsidiary light-emitting elements overlaps one of the second pixel driving units in a thickness direction of the substrate, and wherein a second subsidiary light-emitting element of the plurality of subsidiary light-emitting elements does not overlap the second pixel driving units in the thickness direction of the substrate.

8. The electronic device of claim 1, wherein the sensor driving units are connected to the plurality of photoelectric conversion elements.

9. The electronic device of claim 4, wherein the plurality of subsidiary light-emitting elements and the plurality of photoelectric conversion elements are alternately arranged along one direction.

10. The electronic device of claim 4, wherein the plurality of second pixel driving units and the plurality of sensor driving units are alternately arranged along one direction.

11. The electronic device of claim 4, further comprising:

a pixel unit formed by the plurality of subsidiary light-emitting elements, wherein an area of each of the plurality of photoelectric conversion elements corresponds to an area of the pixel unit.

12. The electronic device of claim 1, wherein an area of each of the plurality of sensor driving units is greater than an area of the first pixel driving unit.

13. The electronic device of claim 2, wherein a first photoelectric conversion element of the plurality of photoelectric conversion elements that is disposed in the first subsidiary area is connected to one of the plurality of sensor driving units, and overlaps another of the plurality of sensor driving units in a thickness direction of the substrate.

14. A display device, comprising:

a substrate that includes a display area and a subsidiary area adjacent to the display area;

a scan driver disposed in the subsidiary area and that applies a scan signal;

a plurality of sensor driving units disposed in the subsidiary area; and a plurality of photoelectric conversion elements disposed in the subsidiary area and connected to the plurality of sensor driving units, respectively, wherein one photoelectric conversion element of the plurality of photoelectric conversion elements overlaps the scan driver in a thickness direction of the substrate.

15. The display device of claim 14, wherein one of the plurality of photoelectric conversion elements does not overlap the plurality of sensor driving units in the thickness direction of the substrate.

16. The display device of claim 14, wherein none of the plurality of sensor driving units overlap the scan driver in the thickness direction of the substrate.

17. The display device of claim 14, wherein the subsidiary area comprises a first subsidiary area and a second subsidiary area, wherein the first subsidiary area is disposed between the display area and the second subsidiary area, wherein the plurality of sensor driving units are disposed in the first subsidiary area, and wherein the scan driver is disposed in the second subsidiary area.

18. The display device of claim 17, further comprising:

a second pixel driving unit disposed in the first subsidiary area; and a plurality of subsidiary light-emitting elements connected to the second pixel driving unit.

19. The display device of claim 18, wherein the second pixel driving unit is closer to the display area than is the sensor driving unit.

20. The display device of claim 14, further comprising a first pixel driving unit disposed in the display area and a light-emitting element connected to the first pixel driving unit.

* * * * *